(12) United States Patent
Mori

(10) Patent No.: US 10,192,795 B2
(45) Date of Patent: Jan. 29, 2019

(54) SEMICONDUCTOR DEVICE

(71) Applicant: Renesas Electronics Corporation, Tokyo (JP)

(72) Inventor: Kazuhisa Mori, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/098,072

(22) Filed: Apr. 13, 2016

(65) Prior Publication Data

US 2016/0365294 A1 Dec. 15, 2016

(30) Foreign Application Priority Data

Jun. 11, 2015 (JP) .................................. 2015-118651

(51) Int. Cl.
| | | |
|---|---|---|
| *H01L 21/66* | (2006.01) | |
| *H01L 27/06* | (2006.01) | |
| *H01L 29/78* | (2006.01) | |
| *H01L 23/34* | (2006.01) | |
| *H01L 29/739* | (2006.01) | |
| *H01L 29/861* | (2006.01) | |

(52) U.S. Cl.
CPC .............. *H01L 22/30* (2013.01); *H01L 23/34* (2013.01); *H01L 27/0629* (2013.01); *H01L 29/7397* (2013.01); *H01L 29/7813* (2013.01); *H01L 29/7815* (2013.01); *H01L 29/8611* (2013.01); *H01L 2924/13055* (2013.01); *H01L 2924/13091* (2013.01)

(58) Field of Classification Search
None
See application file for complete search history.

(56) References Cited

U.S. PATENT DOCUMENTS

| | | |
|---|---|---|
| 5,869,878 A | 2/1999 | Hasegawa |
| 7,507,023 B2 | 3/2009 | Oyabe et al. |
| 8,155,916 B2 * | 4/2012 | Baginski ................. H01L 23/34 |
| | | 702/133 |

(Continued)

FOREIGN PATENT DOCUMENTS

| | | |
|---|---|---|
| JP | H 08-213441 A | 8/1996 |
| JP | H 8-316471 A | 11/1996 |

(Continued)

OTHER PUBLICATIONS

Japanese Office Action, dated Oct. 2, 2018, in Japanese Application No. 2015-118651 and English Translation thereof.

*Primary Examiner* — Telly Green
(74) *Attorney, Agent, or Firm* — McGinn I.P. Law Group, PLLC

(57) ABSTRACT

A semiconductor device including a power transistor is prevented from being broken. A cathode of a temperature sensing diode and a source of a power MOSFET are electrically coupled to each other so as to have the same potential. Such a characteristic point allows the temperature sensing diode to be disposed in a power MOSFET formation region without considering withstand voltage. This means that there is no need to provide an isolating structure that maintains a withstand voltage between the power MOSFET and the temperature sensing diode. Consequently, the power MOSFET and the temperature sensing diode can be closely disposed.

19 Claims, 14 Drawing Sheets

(56) References Cited

U.S. PATENT DOCUMENTS

| | | | | |
|---|---|---|---|---|
| 8,780,517 B2* | 7/2014 | Fukami | ............... | H03K 17/0822 361/93.8 |
| 9,484,418 B2* | 11/2016 | Huang | ................ | H01L 29/7787 |
| 2002/0135037 A1* | 9/2002 | Tomomatsu | ........ | H01L 29/7395 257/467 |
| 2006/0214221 A1* | 9/2006 | Challa | ................ | H01L 21/3065 257/328 |
| 2006/0214222 A1* | 9/2006 | Challa | ................ | H01L 21/3065 257/328 |
| 2007/0004055 A1* | 1/2007 | Ball | ........................ | H01L 23/34 438/14 |
| 2008/0135931 A1* | 6/2008 | Challa | ................ | H01L 21/3065 257/331 |
| 2010/0321846 A1* | 12/2010 | Fukami | ............. | H03K 17/0822 361/91.5 |
| 2011/0001189 A1* | 1/2011 | Challa | ................ | H01L 21/3065 257/341 |
| 2011/0312138 A1* | 12/2011 | Yedinak | .............. | H01L 21/3065 438/270 |
| 2011/0312166 A1* | 12/2011 | Yedinak | .............. | H01L 21/3065 438/488 |
| 2012/0220091 A1* | 8/2012 | Challa | ................ | H01L 21/3065 438/270 |
| 2014/0138701 A1* | 5/2014 | Huang | ................ | H01L 29/7787 257/76 |
| 2014/0264573 A1* | 9/2014 | Kocon | ................ | H01L 21/3065 257/331 |
| 2014/0334522 A1* | 11/2014 | Meiser | ..................... | G01K 7/01 374/178 |

FOREIGN PATENT DOCUMENTS

| | | |
|---|---|---|
| JP | 2006-302977 A | 11/2006 |
| JP | 2009-188335 A | 8/2009 |
| JP | 2010-129707 A | 6/2010 |
| JP | 2011-166518 A | 8/2011 |
| JP | 2014-216465 A | 11/2014 |

* cited by examiner

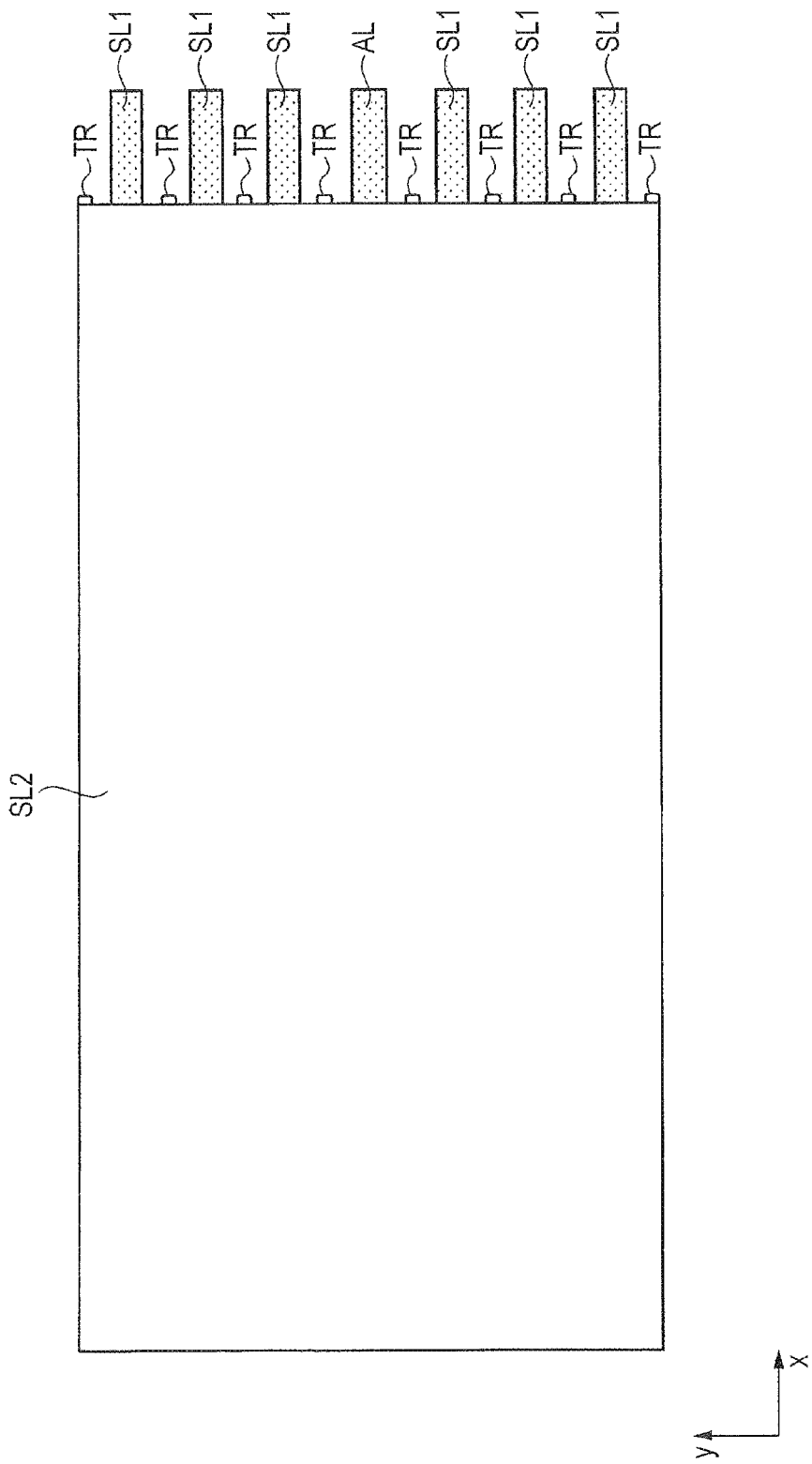

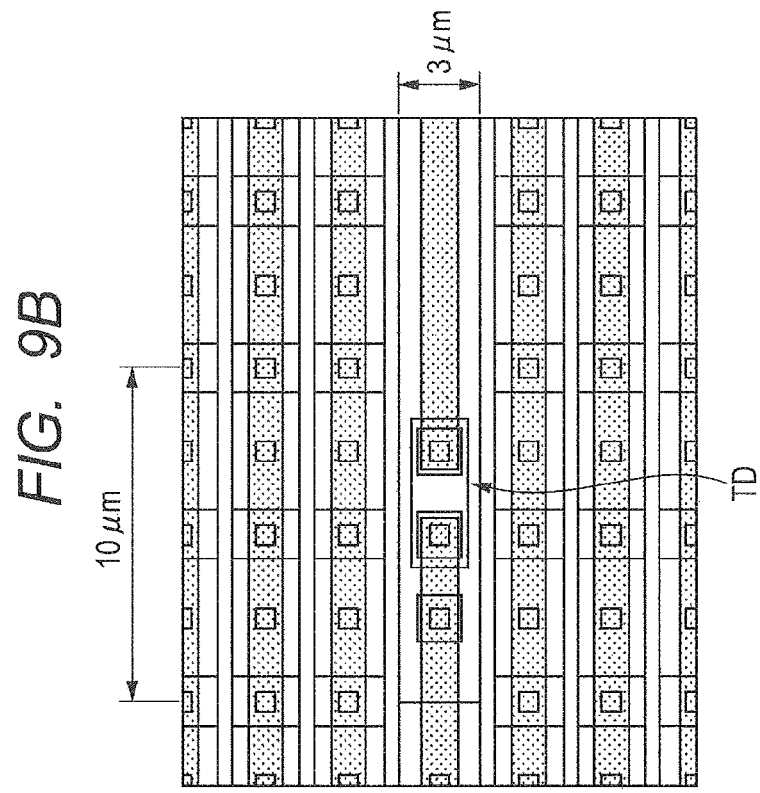
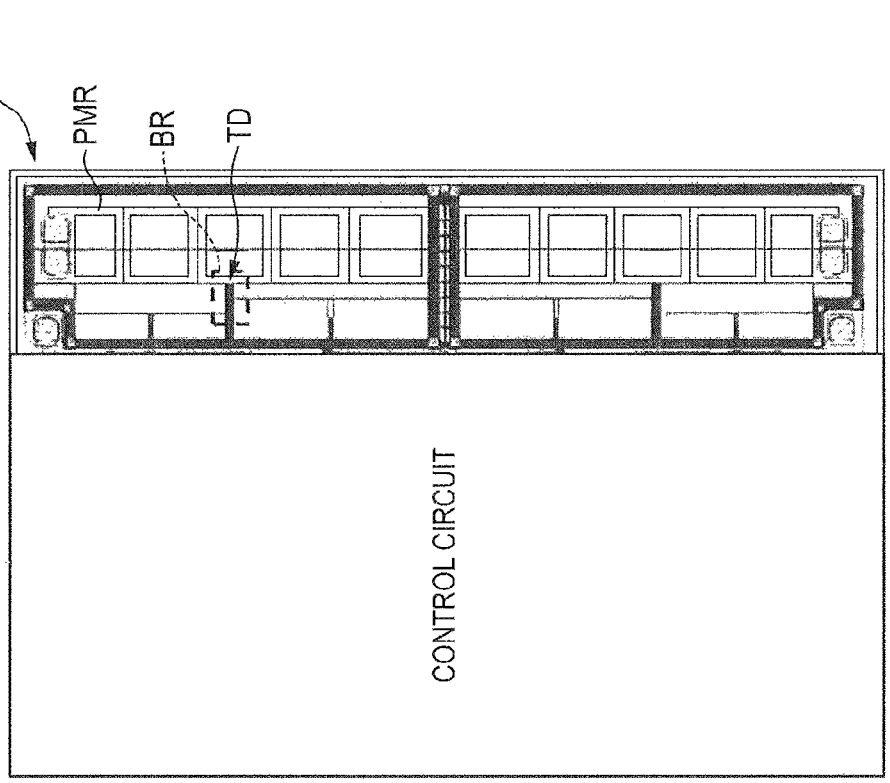

SEMICONDUCTOR DEVICE

CROSS-REFERENCE TO RELATED APPLICATIONS

The disclosure of Japanese Patent Application No. 2015-118651 filed on Jun. 11, 2015 including the specification, drawings and abstract is incorporated herein by reference in its entirety.

BACKGROUND

The present invention relates to a semiconductor device, specifically a technique that is effectively applied to a semiconductor device including a temperature sensing diode.

Japanese Unexamined Patent Application Publication No. 2006-302977 describes a configuration where a cathode of a temperature sensing diode is electrically coupled to an emitter of an insulated gate bipolar transistor (IGBT) via a constant current source.

Japanese Unexamined Patent Application Publication No. Hei 8 (1996)-213441 describes a technique where a temperature-sensed element and a temperature sensing diode are provided in the same semiconductor chip while the temperature sensing diode is disposed in the vicinity of the temperature-sensed element.

SUMMARY

For example, if an abnormal large current is applied to a power transistor handling high power due to load short or the like, the power transistor produces heat and is broken. In an existing technique, therefore, a temperature sensing diode is provided in a semiconductor chip having a power transistor, and a variation in temperature of the power transistor is monitored by the temperature sensing diode. Specifically, a previously developed intelligent power device (IPD) prevents breakdown of a power transistor due to abnormal heating, in which, for example, if the temperature sensed by the temperature sensing diode exceeds a certain value, the power transistor is controlled to be turned off, so that breakdown of the power transistor is prevented.

A variation in temperature of the power transistor is importantly sensed with rapidity by the temperature sensing diode in order to effectively prevent breakdown of the power transistor. Specifically, the temperature sensing diode is required to have a good response characteristic (following capability of temperature sensing) to heating of the power transistor in order to suppress breakdown of the power transistor. Hence, for example, the temperature sensing diode has been disposed within a power transistor formation region in order to improve the following capability of temperature sensing of the temperature sensing diode.

However, the temperature sensing diode is electrically isolated from the power transistor to provide the degree of freedom in circuit design. Specifically, in a currently used configuration, while the temperature sensing diode is disposed in the power transistor formation region, the temperature sensing diode is electrically isolated from the power transistor to improve general versatility of the temperature sensing diode thereby to couple the temperature sensing diode to any of circuits having various potentials.

However, when such a configuration is used, different potentials are applied to the power transistor and the temperature sensing diode. As a result, there is a need to maintain a withstand voltage between the power transistor and the temperature sensing diode. Hence, when the temperature sensing diode is disposed in the power transistor formation region, an isolating structure must be provided between the temperature sensing diode and the power transistor in order to maintain the withstand voltage. Although the temperature sensing diode is especially disposed in the power transistor formation region in order to improve the following capability of temperature sensing of the temperature sensing diode, such an isolating structure leads to an increase in distance between the power transistor and the temperature sensing diode. This means that time is required for heat conduction from the power transistor as a heat source to the temperature sensing diode, which degrades the following capability of temperature sensing (response characteristic) to abrupt heating of the power transistor. As a result, the power transistor cannot be sufficiently prevented from being broken by heating. Thus, the existing technique has a room for improvement in light of improving the following capability of temperature sensing of the temperature sensing diode to abrupt heating of the power transistor.

Other issues and novel features will be clarified from the description of this specification and the accompanying drawings.

According to one embodiment of the invention, there is provided a semiconductor device, in which a low-potential terminal of a power transistor and a cathode of a temperature sensing diode are electrically coupled to each other so as to have the same potential.

According to the one embodiment, the semiconductor device including the power transistor can be prevented from being broken.

BRIEF DESCRIPTION OF THE DRAWINGS

FIG. 7 is a plan view illustrating a configuration of a source interconnection (second layer) disposed over a source interconnection (first layer).

FIG. 9A illustrates a layout configuration of a semiconductor chip, and FIG. 9B illustrates a temperature sensing diode disposed in a region of FIG. 9A in an enlarged manner.

DETAILED DESCRIPTION

Although each of the following embodiments may be dividedly described in a plurality of sections or embodiments for convenience as necessary, they are not unrelated to one another except for the particularly defined case, and are in a relationship where one is a modification, a detail, supplementary explanation, or the like of part or all of another one.

In each of the following embodiments, when the number of elements (including the number, a numerical value, amount, and a range) is mentioned, the number is not limited to a specified number except for the particularly defined case and for the case where the number is principally clearly limited to the specified number. In other words, the number may be not less than or not more than the specified number.

In each of the following embodiments, it will be appreciated that a constitutional element (including an element step) of the embodiment is not necessarily indispensable except for the particularly defined case and for the case where the constitutional element is probably indispensable in principle.

Similarly, in each of the following embodiments, when configurations such as a shape of a constitutional element and a positional relationship are described, any configuration substantially closely related to or similar to one of those configurations should be included except for the particularly defined case and for the case where that configuration is probably not included in principle. The same holds true in each of the numerical value and the range.

In all drawings for explaining the following embodiments, the same components are designated by the same numeral, and duplicated description is omitted. A plan diagram may also be hatched for better viewability.

First Embodiment

Circuit Configuration of Semiconductor Device

For example, the semiconductor device of the first embodiment is assumed to be an intelligent power device, and includes a power transistor serving as a switching element and a control circuit that controls the power transistor. The semiconductor device (intelligent power device) of the first embodiment performs the basic function of driving a load by a power transistor as a switching element, and performs, in association with the basic function, a protective function of preventing breakdown of the power transistor due to abnormal heating by a control circuit.

Figure 1:
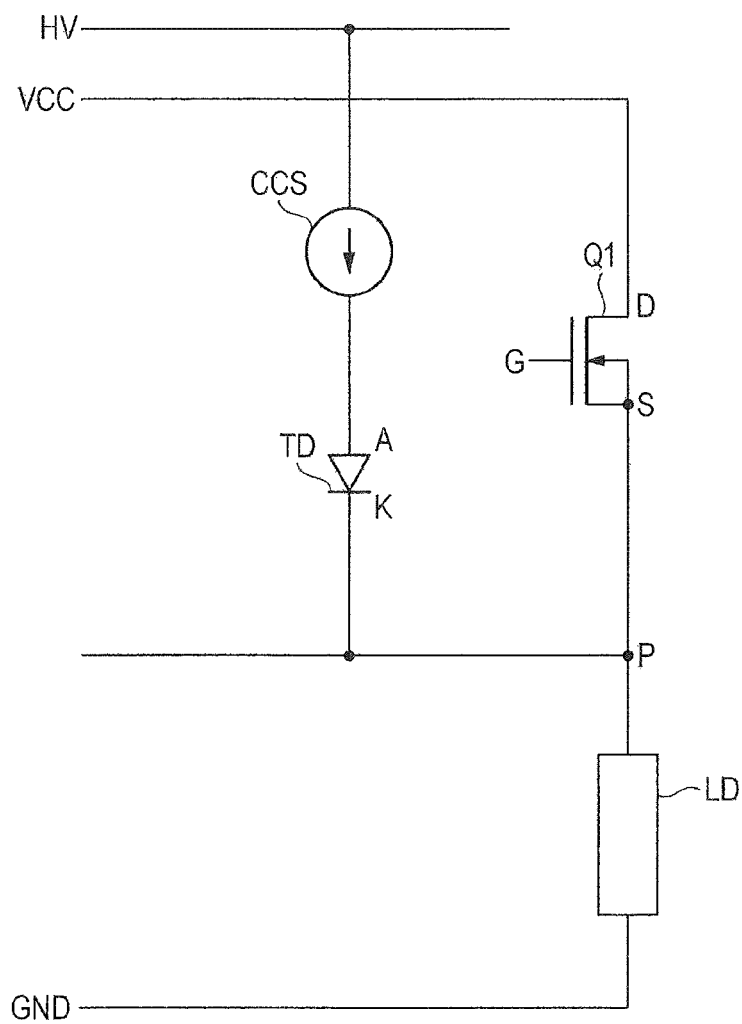
FIG. 1 is a circuit diagram illustrating an exemplary circuit configuration of a semiconductor device according to a first embodiment.

FIG. 1 is a circuit diagram illustrating an exemplary circuit configuration of a semiconductor device according to the first embodiment. The semiconductor device of the first embodiment configures a high-side switch using a power metal oxide semiconductor field effect transistor (MOSFET) as the power transistor, for example. Specifically, FIG. 1 illustrates a circuit configuration of a semiconductor device with a power MOSFET Q1 as a switching element that drives a load LD. Specifically, as illustrated in FIG. 1, the semiconductor device of the first embodiment includes the power MOSFET Q1 serving as the switching element, a temperature sensing diode TD that senses temperature of the power MOSFET Q1, and a constant current source CCS that supplies a current having a certain value to the temperature sensing diode TD, and configures the high-side switch that drives the load LD.

For example, as illustrated in FIG. 1, in the first embodiment, the power MOSFET Q1 and the load LD are coupled in series between a power line VCC through which a power potential is supplied, and a reference line (ground line) GND through which a reference potential (ground potential) is supplied. That is, the drain D of the power MOSFET Q1 is disposed on a side close to the power line VCC, and the source S thereof is disposed on a side close to the load. The load LD is coupled between the source S of the power MOSFET Q1 and the reference line GND. The gate electrode G of the power MOSFET Q1 is electrically coupled to an undepicted gate drive circuit.

In such a circuit configuration, the power MOSFET Q1 is disposed on a power potential side having a potential higher than that of the load LD, and is therefore called high-side switch. For the high-side switch, for example even if the load LD is short-circuited to the reference line GND, short-circuit only occurs between a node P and the reference line GND as illustrated in FIG. 1 because the power MOSFET Q1 is provided between the node P and the power line VCC. Hence, the high-side switch allows a design such that even if the load LD is short-circuited to the reference line GND, no short-circuit current flows between the power line VCC and the reference line GND by turning off the power MOSFET Q1. The high-side switch therefore advantageously allows formation of a safe switching circuit that is highly resistant to short-circuit of the load LD.

As illustrated in FIG. 1, the semiconductor device of the first embodiment includes the temperature sensing diode TD that senses temperature of the power MOSFET Q1. The cathode K of the temperature sensing diode TD and the source S of the power MOSFET Q1 are electrically coupled to each other so as to have the same potential, and the anode A of the temperature sensing diode TD is electrically coupled to a high-potential line HV via a constant current source CCS that supplies a constant current to the temperature sensing diode TD. The high-potential line HV is electrically coupled to a charge pump circuit or a bootstrap circuit, and receives a potential higher than a source potential.

The temperature sensing diode is configured of, for example, a p-n junction diode of which the voltage value (VF) varies depending on temperature so as to decrease with an increase in temperature. The first embodiment uses such a property of the temperature sensing diode TD. Specifically, a current having a certain value is applied to the temperature sensing diode TD by the constant current source CCS, and a voltage value across the temperature sensing diode TD is measured, thereby temperature can be indirectly monitored. Specifically, referring to FIG. 1, the temperature of the power MOSFET Q1 can be indirectly sensed by the temperature sensing diode TD through measuring a voltage between the high-potential line HV and the node P, which sandwich the temperature sensing diode TD. That is, when a current having a certain value is applied to the temperature sensing diode TD, the voltage value across the temperature sensing diode TD decreases with an increase in temperature. Hence, the temperature can be indirectly sensed by monitoring the voltage value.

In an actual application (intelligent power device), the voltage value (temperature signal) of the temperature sensing diode TD is thus measured and fed back to a control circuit, thereby when the sensed temperature is equal to or higher than a certain temperature, a gate signal is blocked from being applied to the gate electrode G of the power MOSFET Q1. This protects the power MOSFET Q1 from being broken.

Circuit Operation of Semiconductor Device

The semiconductor device of the first embodiment has the circuit configured as described above, and operation of the circuit is now described with reference to FIG. 1.

Referring to FIG. 1, a voltage equal to or higher than a threshold voltage is applied from an undepicted gate drive circuit to the gate electrode G of the power MOSFET Q1. The power MOSFET Q1 is turned on thereupon, and a current flows along a path including the power line VCC, the power MOSFET Q1, the load LD, and the reference line GND in this order. This allows the load LD to be driven.

Referring to FIG. 1, a voltage lower than the threshold voltage is applied from the gate drive circuit to the gate electrode G of the power MOSFET Q1. The power MOSFET Q1 is turned off thereupon, and the current is blocked from being applied to the load LD.

In this way, according to the first embodiment, the gate voltage applied from the gate drive circuit to the gate electrode G of the power MOSFET Q1 is controlled to turn on or off the power MOSFET Q1, thereby the current applied to the load LD can be controlled.

The temperature sensing operation of the power MOSFET Q1 is now described. Referring to FIG. 1, while the power MOSFET Q1 is operated through control with the gate drive circuit, a current having a certain value is applied to the temperature sensing diode TD by the constant current source CCS. At this time, for example, when the temperature of the power MOSFET Q1 is about room temperature (25° C.), the voltage value (VF) across the temperature sensing diode TD is about 0.6 V. If an abnormal large current is applied to the power MOSFET Q1 due to load short or the like, the power MOSFET Q1 produces heat. For example, if the temperature of the power MOSFET Q1 increases to about 175° C., a voltage value (VF) across the temperature sensing diode TD becomes about 0.3 V. During this operation, for example, the voltage value (VF) across the temperature sensing diode TD is monitored by a control circuit configuring the semiconductor device (intelligent power device). Hence, for example, if the control circuit receives a voltage value of about 0.3 V, the control circuit determines that the temperature of the power MOSFET Q1 exceeds a specified value, and applies a voltage lower than the threshold voltage to the gate electrode G of the gate electrode G. As a result, the power MOSFET Q1 is turned off, so that the power MOSFET Q1 can be protected from being broken by heating.

Hence, prompt sensing of a variation in temperature of the power MOSFET Q1 by the temperature sensing diode TD is important in order to effectively prevent breakdown of the power MOSFET Q1. That is, a good response characteristic (following capability of temperature sensing) of the temperature sensing diode TD to heating of the power MOSFET Q1 is required in order to suppress breakdown of the power MOSFET Q1. The semiconductor device of the first embodiment is therefore designed to improve the response characteristic of the temperature sensing diode TD. The characteristic point of the first embodiment is now described.

Circuital Characteristic Point of First Embodiment

The circuital characteristic point of the first embodiment is that the cathode K of the temperature sensing diode TD and the source S of the power MOSFET Q1 are electrically coupled to each other so as to have the same potential as illustrated in FIG. 1, for example. Consequently, according to the first embodiment, there is no need to maintain the withstand voltage between the temperature sensing diode TD and the power MOSFET Q1. Specifically, in the first embodiment, the power MOSFET Q1 and the temperature sensing diode TD are provided in the same semiconductor chip, and the temperature sensing diode TD is disposed in a power MOSFET formation region in which the power MOSFET Q1 is provided. Hence, there is a need to maintain the withstand voltage between the power MOSFET Q1 and the temperature sensing diode TD. In particular, since the source S of the power MOSFET Q1 and the temperature sensing diode TD are provided together on a surface side of the semiconductor chip, there is a need to maintain the withstand voltage between the source S of the power MOSFET Q1 and the temperature sensing diode TD.

On this point, according to the first embodiment, as illustrated in FIG. 1, the cathode K of the temperature sensing diode TD and the source S of the power MOSFET Q1 are electrically coupled to each other so as to have the same potential. Consequently, the source S of the power MOSFET Q1 and the cathode K of the temperature sensing diode TD have the same potential; hence, there is no need to maintain the withstand voltage. Furthermore, since the anode A of the temperature sensing diode TD has a potential higher than the potential of the cathode K only by an amount equal to the VF value (about 0.6 V), the withstand voltage between the anode A of the temperature sensing diode TD and the source S of the power MOSFET Q1 is not a significant issue.

As described above, the first embodiment has the characteristic point that the cathode K of the temperature sensing diode TD and the source S of the power MOSFET Q1 are electrically coupled to each other so as to have the same potential, which makes it possible to dispose the temperature sensing diode TD in the power MOSFET formation region without considering the withstand voltage. This means that an isolating structure for maintaining the withstand voltage may not be provided between the power MOSFET Q1 and the temperature sensing diode TD. In addition, this means that the power MOSFET Q1 and the temperature sensing diode TD can be closely disposed. In other words, a distance between the power MOSFET Q1 and the temperature sensing diode TD is long for the semiconductor device having the isolating structure, but is short for the semiconductor device having no isolating structure. As a result, according to the first embodiment, since heat produced by the power MOSFET Q1 is readily conducted to the temperature sensing diode TD, actual temperature of the power MOSFET Q1 can be accurately sensed by the temperature sensing diode TD. In other words, according to the first embodiment, time for heat conduction from the power MOSFET Q1 as a heat source to the temperature sensing diode TD can be reduced, which improves the following capability of temperature sensing (response characteristic) to abrupt heating of the power MOSFET Q1. As a result, according to the characteristic point of the first embodiment, the temperature of the power MOSFET Q1 can be accurately sensed by the temperature sensing diode TD; hence, the power MOSFET Q1 can be effectively prevented from being broken by heating.

For example, when the temperature sensing diode TD is electrically isolated from the power MOSFET Q1, different potentials are applied to the cathode K of the temperature sensing diode TD and the source S of the power MOSFET Q1. Consequently, there is the need to maintain the withstand voltage between the cathode K of the temperature sensing diode TD and the source S of the power MOSFET Q1. Hence, even if the temperature sensing diode TD is intentionally provided in the power MOSFET formation region in order to sense accurate temperature of the power MOSFET Q1, the isolating structure must be provided between the power MOSFET Q1 and the temperature sensing diode TD in order to maintain the withstand voltage. As a result, the distance between the power MOSFET Q1 and the temperature sensing diode TD is increased due to such provision of the isolating structure, leading to degradation in response characteristic of the temperature sensing diode TD. In such a case, abrupt heating of the power MOSFET Q1 cannot be promptly sensed by the temperature sensing diode TD. As a result, the protective circuit cannot be effectively operated, and thus the power MOSFET Q1 cannot be effectively protected from being broken by heating.

In contrast, in the first embodiment, the cathode K of the temperature sensing diode TD and the source S of the power MOSFET Q1 are electrically coupled to each other so as to have the same potential. Thus, according to the first embodiment, there is no need to maintain the withstand voltage between the power MOSFET Q1 and the temperature sensing diode TD. This means that there is no need to provide the isolating structure for maintaining the withstand voltage between the power MOSFET Q1 and the temperature sensing diode TD. Hence, according to the first embodiment, there is no need to provide the isolating structure between the power MOSFET Q1 and the temperature sensing diode TD. As a result, the distance between the power MOSFET Q1 and the temperature sensing diode TD can be reduced. This improves the following capability (response characteristic) of temperature sensing of the temperature sensing diode TD. Hence, for example, even if the power MOSFET Q1 abruptly produces heat, the temperature of the power MOSFET Q1 can be accurately sensed. Thus, according to the first embodiment, even if the power MOSFET Q1 abruptly produces heat, such heating can be promptly sensed by the temperature sensing diode TD, and thus the protective circuit can be operated to turn off the power MOSFET Q1 before breakdown of the power MOSFET Q1. Consequently, according to the first embodiment, the power MOSFET Q1 can be effectively protected from being broken.

The power MOSFET Q1 configuring the high-side switch may be configured of either of n-channel MOSFET and p-channel MOSFET. In particular, when the n-channel MOSFET is used, the basic idea of the first embodiment can be embodied without significant modification of the circuit. This point is now described.

A case where the power MOSFET Q1 is configured of the n-channel MOSFET is considered. In such a case, referring to FIG. 1, since the on resistance of the power MOSFET Q1 itself is small, when the power MOSFET Q1 is turned on, the power line VCC coupled to the drain D of the power MOSFET Q1 has a potential substantially equal to that of the node P coupled to the source S of the power MOSFET Q1. A voltage, which is higher than a voltage of the source S by an amount equal to or higher than a certain value, must be applied to the gate electrode G in order to turn on the n-channel MOSFET (power MOSFET Q1). In addition, a potential higher than the source potential must be supplied to the gate electrode G in consideration that the potential of the source S is roughly equal to the source potential (source voltage). That is, when the high-side switch is configured of the n-channel MOSFET, a voltage higher than the source voltage must be applied to the gate electrode G. Hence, when the high-side switch is configured of the n-channel MOSFET, a boosting circuit typified by the charge pump circuit or the bootstrap circuit is necessary in the gate drive circuit that supplies a gate voltage to the gate electrode G.

For the high-side switch configured in this way, when it is intended to achieve the circuital characteristic point of the first embodiment, i.e., the characteristic point that the cathode K of the temperature sensing diode TD and the source S of the power MOSFET Q1 are electrically coupled to each other so as to have the same potential, the anode of the temperature sensing diode TD cannot be coupled to the power line VCC. This is because, as described above, when the power MOSFET Q1 is on, the drain D and the source S have substantially the same potential. This means that when the anode A of the temperature sensing diode TD is coupled to the power line VCC, substantially no potential difference exists between the anode A and the cathode K of the temperature sensing diode TD. The constant current source CCS therefore cannot apply a current to the temperature sensing diode TD. As a result, the temperature sensing diode TD is difficult to be operated. Hence, for the high-side switch configured of the n-channel MOSFET, if it is intended to achieve the characteristic point that the cathode K of the temperature sensing diode TD and the source S of the power MOSFET Q1 are electrically coupled to each other so as to have the same potential, the anode A of the temperature sensing diode TD is necessarily coupled to the high-potential line HV through which a potential higher than the source potential is supplied, as illustrated in FIG. 1.

For the high-side switch configured of the n-channel MOSFET, the boosting circuit typified by the charge pump circuit or the bootstrap circuit has been provided because a potential higher than the source potential must be supplied to the gate electrode G. Hence, while the previously provided boosting circuit is used, the temperature sensing diode TD is coupled to the high-potential line HV through which a high potential produced by the boosting circuit is supplied, so that the circuit configuration illustrated in FIG. 1 can be easily achieved. In short, for the high-side switch configured of the n-channel MOSFET, it is possible to embody the technical idea of the first embodiment without significant modification of the circuit by using the previously provided boosting circuit.

When the high-side switch is configured of the p-channel MOSFET, the high-side switch is turned on by applying 0 V to the gate electrode G; hence, a potential higher than the source potential is basically unnecessary to be supplied to the gate electrode G. In other words, for the high-side switch configured of the p-channel MOSFET, the boosting circuit typified by the charge pump circuit or the bootstrap circuit is not necessary. However, if it is intended to achieve the circuital characteristic point of the first embodiment, i.e., the characteristic point that the cathode K of the temperature sensing diode TD and the source S of the power MOSFET Q1 are electrically coupled to each other so as to have the same potential, the anode A of the temperature sensing diode TD is necessarily coupled to the high-potential line HV through which a potential higher than the source potential is supplied, as illustrated in FIG. 1. Hence, although the bootstrap circuit is basically unnecessary for the high-side switch configured of the p-channel MOSFET, if the circuital characteristic point of the first embodiment is embodied, the boosting circuit is necessary. Consequently, for the high-side switch configured of the p-channel MOSFET, a design must be greatly changed compared with a case where the high-side switch is configured of the n-channel MOSFET.

As described above, the high-side switch is desirably configured of the n-channel MOSFET rather than the p-channel MOSFET in light of embodying the technical idea of the first embodiment without a major design change. However, the high-side switch may be configured of the n-channel MOSFET or the p-channel MOSFET in light of achieving the technical idea of the first embodiment.

Device Structure of Semiconductor Device

A device structure of the semiconductor device of the first embodiment is now described.

Figure 2:
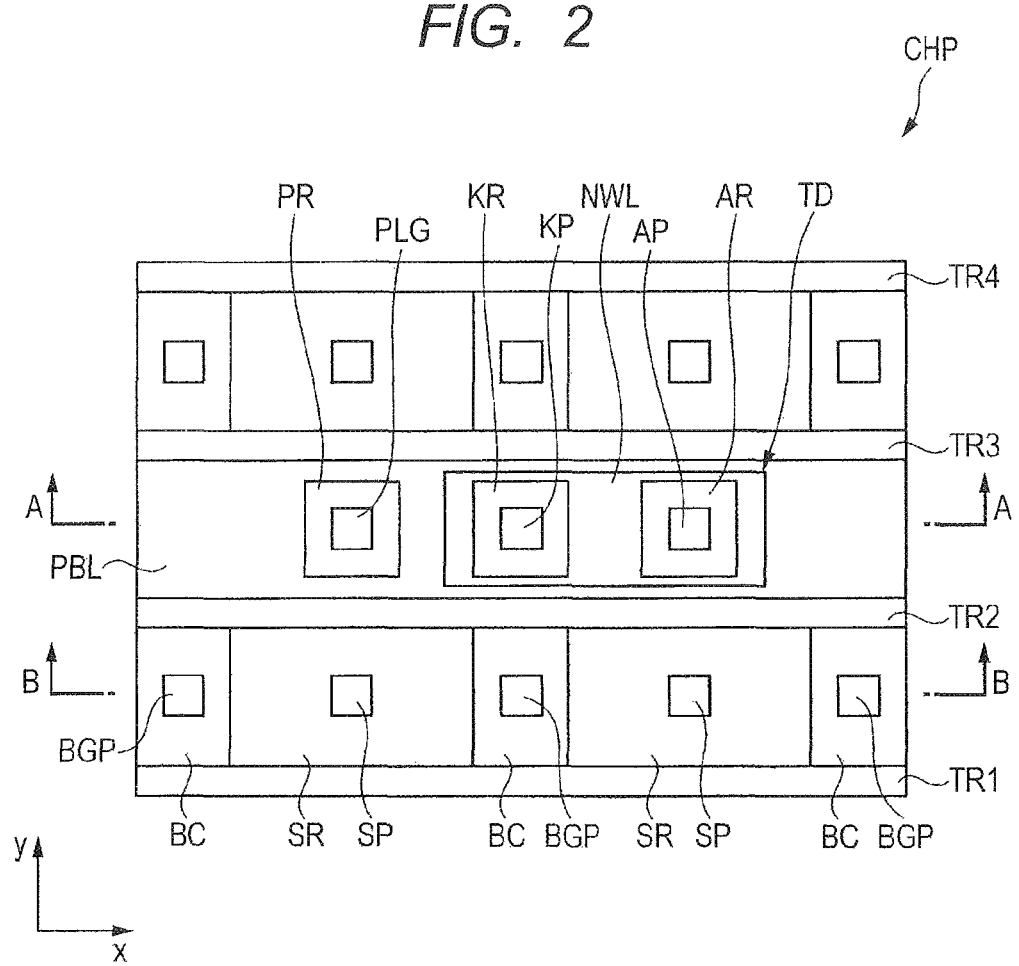
FIG. 2 is a partial enlarged view of a semiconductor chip of the first embodiment.

FIG. 2 is a plan view illustrating a partial region of a semiconductor chip CHP of the first embodiment. Referring to FIG. 2, a plurality of trenches TR1 to TR4 are provided on a surface of the semiconductor chip CHP, and extend in an x direction while being separated from one another. Each of the trenches TR1 to TR4 serves as a gate electrode of the power MOSFET.

As illustrated in FIG. 2, source regions SR and body contact regions BC of the power MOSFET are provided so as to be sandwiched by the trenches TR1 and TR2 in a plan view. The source regions SR and the body contact regions BC are alternately disposed. Each source region SR is formed of an n-type semiconductor region, while each body contact region BC is formed of a p-type semiconductor region. The source region SR is electrically coupled to a source plug SP, while the body contact region BC is electrically coupled to a back gate plug BGP.

As illustrated in FIG. 2, the temperature sensing diode TD is provided so as to be sandwiched by the trenches TR2 and TR3 in a plan view. That is, in the first embodiment, the temperature sensing diode TD is disposed so as to be adjacent to the power MOSFET. Specifically, a p-type base layer PBL is provided so as to be sandwiched by the trenches TR2 and TR3, and an n-type well NWL is provided in the p-type base layer PBL. A cathode region KR including an n-type semiconductor region and an anode region AR including a p-type semiconductor region are provided in the inside of the n-type well NWL while being separated from each other. A p-type semiconductor region PR having an impurity concentration higher than that of the p-type base layer PBL is provided in the p-type base layer PBL outside of the n-type well NWL.

The cathode region KR is electrically coupled to a cathode plug KP, while the anode region AR is electrically coupled to an anode plug AP. The p-type semiconductor region PR is electrically coupled to a plug PLG.

The source regions (SR) and the body contact regions (BC) of the power MOSFET are provided in a region sandwiched by the trenches TR3 and TR4, as with the region sandwiched by the trenches TR1 and TR2.

Thus, the semiconductor chip CHP of the first embodiment has the power MOSFET and the temperature sensing diode TD. In particular, the temperature sensing diode TD is provided so as to be sandwiched by portions of the power MOSFET.

Figure 3:
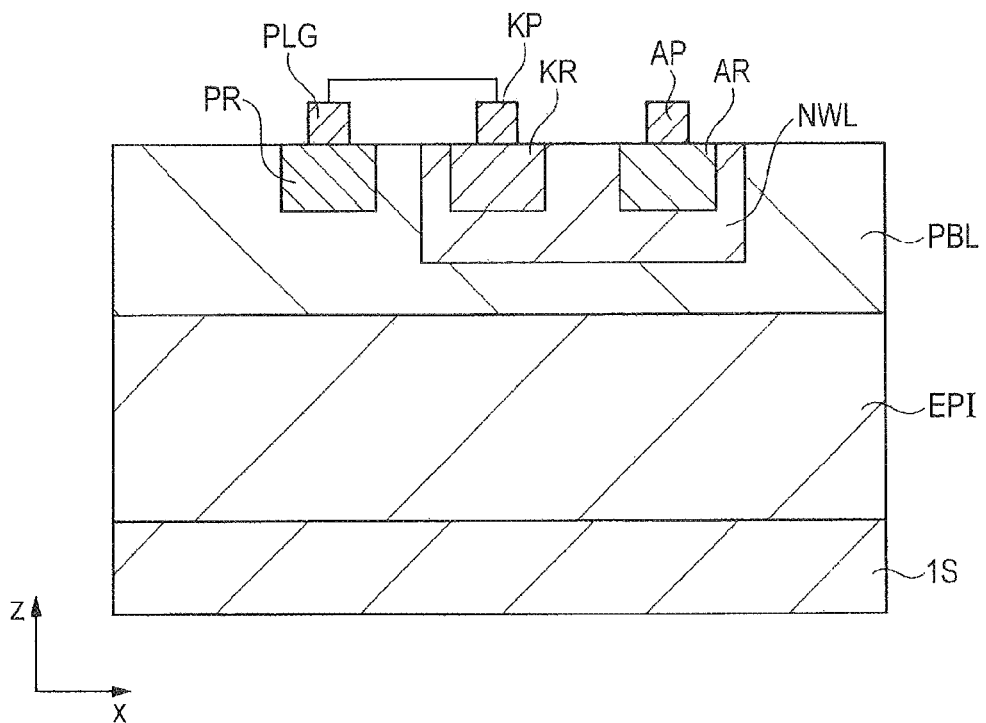
FIG. 3 is a section view along a line A-A in FIG. 2.

FIG. 3 is a section view along a line A-A in FIG. 2. As illustrated in FIG. 3, an epitaxial layer EPI including an n-type semiconductor region is provided on a semiconductor substrate 1S, and the p-type base layer PBL including a p-type semiconductor region is provided on the epitaxial layer EPI. The p-type semiconductor region PR and the n-type well NWL are separately provided in the p-type base layer PBL, and the cathode region KR and the anode region AR of the temperature sensing diode are separately provided within the n-type well NWL. The plug PLG is provided on the p-type semiconductor region PR, and the cathode plug KP is provided on the cathode region KR. The plug PLG is electrically coupled to the cathode plug KP. The anode plug AP is provided on the anode region AR.

Figure 4:
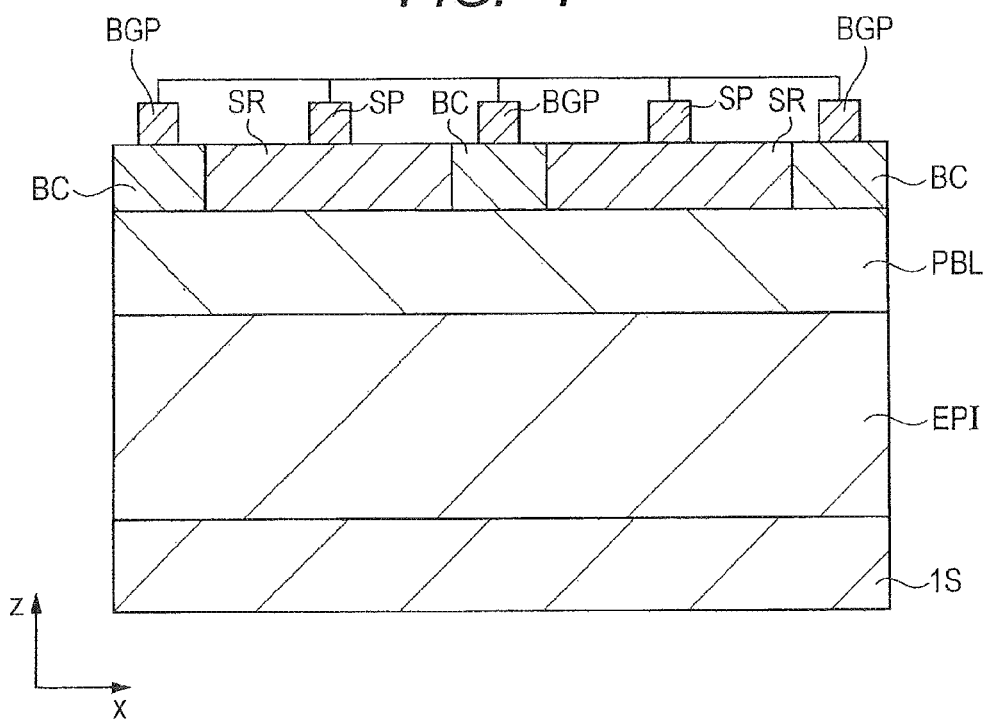
FIG. 4 is a section view along a line B-B in FIG. 2.

FIG. 4 is a section view along a line B-B in FIG. 2. As illustrated in FIG. 4, the epitaxial layer EPI including the n-type semiconductor region is provided on the semiconductor substrate 1S, and the p-type base layer PBL including the p-type semiconductor region is provided on the epitaxial layer EPI. The semiconductor substrate 1S and the epitaxial layer EPI serve as a drain region of the power MOSFET, and an undepicted drain electrode of the power MOSFET is provided on the back of the semiconductor substrate 1S.

As illustrated in FIG. 4, the source regions SR each including the n-type semiconductor region and the body contact regions BC each including the p-type semiconductor region are alternately disposed on the surface of the p-type base layer PBL. The source plug SP is provided on each source region SR, and the back gate plug BGP is provided on each body contact region BC. As illustrated in FIG. 4, the source plug SP is electrically coupled to the back gate plug BGP.

Figure 5:
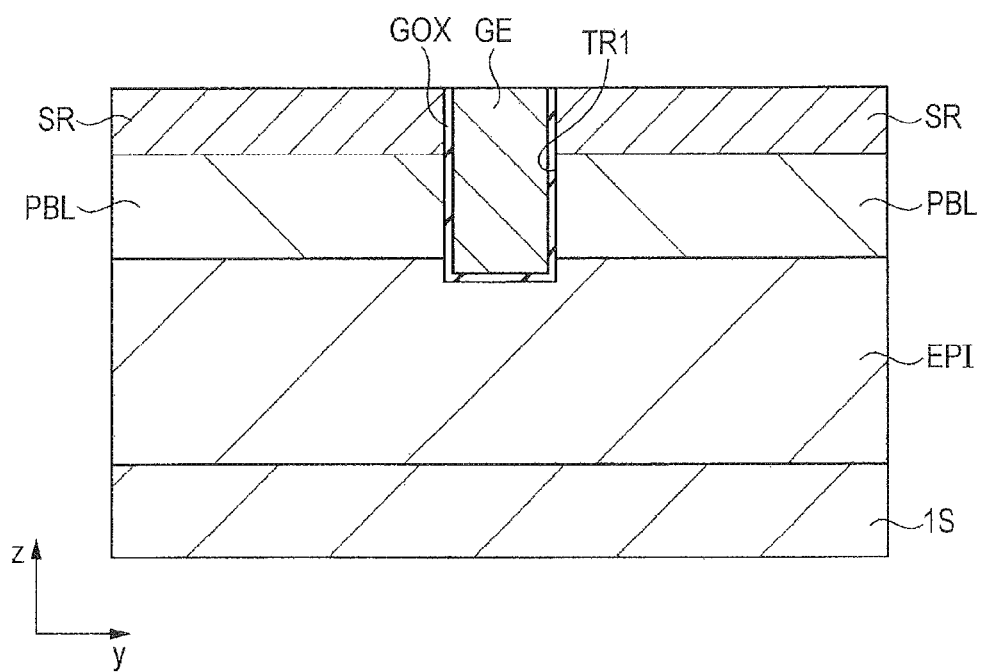
FIG. 5 is a section view illustrating a sectional structure of a trench.

FIG. 5 is a section view illustrating a sectional structure of the trench TR1. As illustrated in FIG. 5, the epitaxial layer EPI including the n-type semiconductor region is provided on the semiconductor substrate 1S, and the p-type base layer PBL including the p-type semiconductor region is provided on the epitaxial layer EPI. The source region SR including the n-type semiconductor region is provided on the surface of the p-type base layer PBL. The trench TR1 runs up to the epitaxial layer EPI through the source region SR and the p-type base layer PBL. A gate insulating film GOX including, for example, a silicon oxide film is provided over the inner wall of the trench TR1, and a gate electrode GE is provided over the gate insulating film GOX so as to fill the trench TR1. The gate electrode GE is formed of, for example, a polysilicon film.

In the power MOSFET configured in this way, when a voltage equal to or higher than the threshold voltage is applied to the gate electrode GE, a channel called inversion layer is formed in a region of the p-type base layer PBL in contact with the trench TR1, and electrons flow through the channel from the source region SR to the epitaxial layer EPI and the semiconductor substrate 1S serving as the drain region. In other words, an on current flows from the drain region (semiconductor substrate 1S and the epitaxial layer EPI) to the source region SR through the channel.

Figure 6:
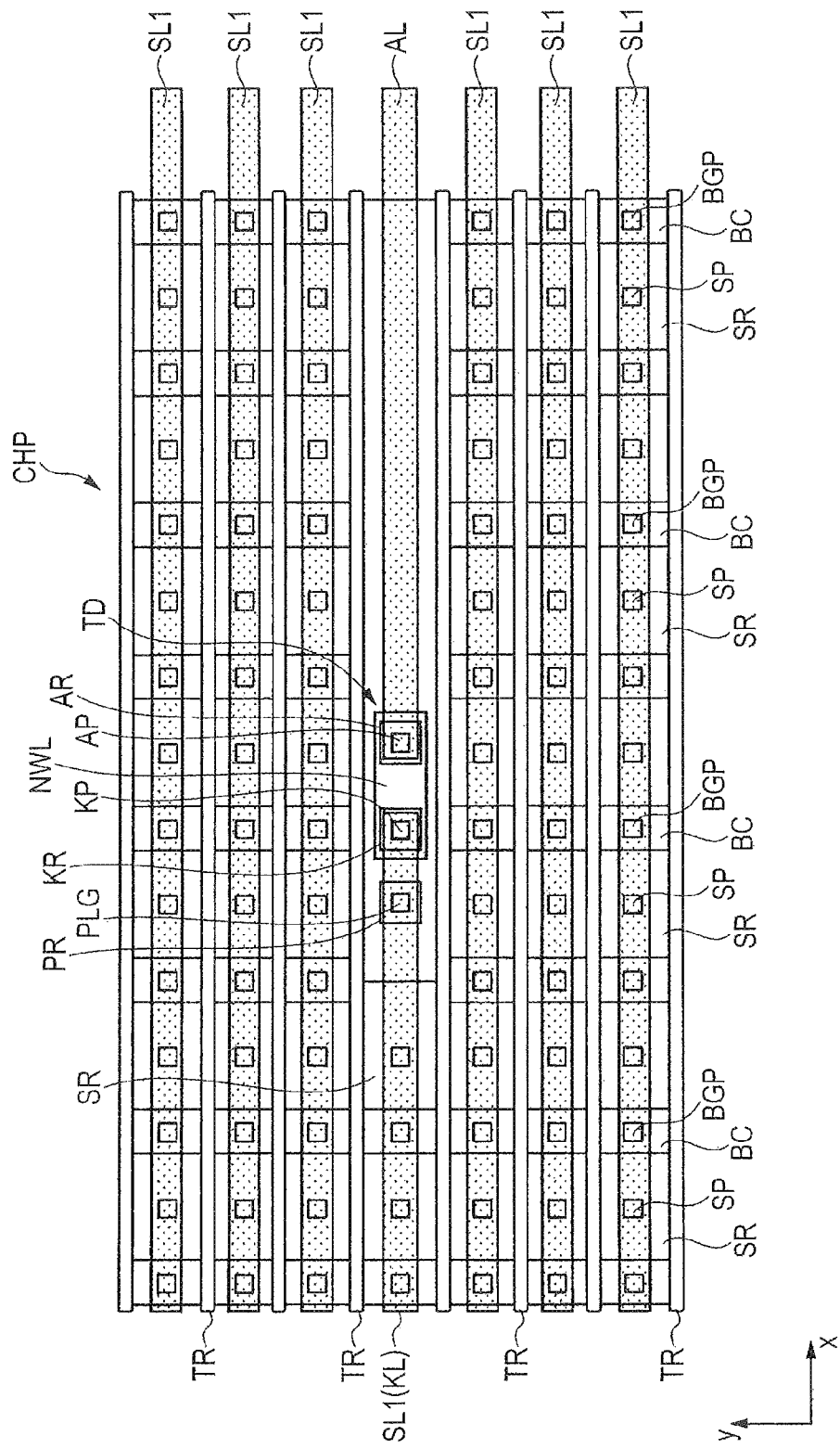
FIG. 6 is a plan view schematically illustrating an interconnection structure disposed on a device structure of the semiconductor device of the first embodiment.

The interconnection structure of the semiconductor device of the first embodiment is now described. FIG. 6 is a plan view schematically illustrating an interconnection structure disposed on the device structure of the semiconductor device of the first embodiment. As illustrated in FIG. 6, source interconnections SL1 are arranged in parallel with the trenches TR extending in the x direction. Specifically, each source interconnection SL1 is disposed so as to be sandwiched by the trenches adjacent to each other, and extends in the x direction. The source interconnection SL1 is electrically coupled to the source region SR of the power MOSFET via the source plug SP, and is further electrically coupled to the body contact region BC of the power MOSFET via the back gate plug BGP. Thus, the source region SR and the body contact region BC of the power MOSFET are electrically coupled to each other by the source interconnection SL1. That is, the source region SR and the body contact region BC of the power MOSFET have the same potential. In other words, given the fact that the body contact region BC is electrically coupled to the p-type base layer (PBL), the source region SR and the p-type base layer (PBL) of the power MOSFET are coupled to each other with the same potential. Consequently, according to the first embodiment, it is possible to suppress operation of a parasitic NPN bipolar transistor including the epitaxial layer (EPI) as a collector region, the p-type base layer (PBL) as a base layer, and the source region SR as an emitter region. This is because, as described above, the first embodiment is designed such that the source interconnection SL1 allows the source region SR and the p-type base layer (PBL) to have the same potential. Specifically, the source region SR and the p-type base layer (PBL) have the same potential, which means no difference in potential between the base and the emitter of the parasitic NPN bipolar transistor. It is therefore possible to suppress on operation of the parasitic NPN bipolar transistor due to a predetermined potential difference produced between the base and the emitter.

Referring to FIG. 6, the temperature sensing diode TD is provided in the vicinity of the center of the semiconductor chip CHP. The cathode region KR of the temperature sensing diode TD and the p-type semiconductor region PR are electrically coupled to each other by the source interconnection SL1 (cathode interconnection KL) via the cathode plug KP and the plug PLG. The source interconnection SL1 is also coupled to the source region (SR) and the body contact region (BC) of the power MOSFET. Thus, as illustrated in FIG. 6, the cathode region KR of the temperature sensing diode is electrically coupled to the source region SR of the power MOSFET along a path including the cathode plug KP, the source interconnection SL1 (cathode interconnection KL), the source plug SP, and the source region SR in this order. In this way, the circuital characteristic point of the first embodiment is achieved by the device structure of the semiconductor device of the first embodiment.

FIGS. 3, 4, and 6 show that the cathode region KR of the temperature sensing diode is also coupled to the source region SR of the power MOSFET through another path. Specifically, as illustrated in FIG. 3, the cathode region KR of the temperature sensing diode TD is electrically coupled to the p-type semiconductor region PR via the cathode plug KP, the source interconnection (SL1), and the plug PLG that are electrically coupled to one another. Since the p-type semiconductor region PR and the p-type base layer PBL each include a p-type semiconductor region, they are electrically coupled to each other. In addition, as illustrated in FIG. 4, since the p-type base layer PBL and the body contact region BC each include a p-type semiconductor region, they are electrically coupled to each other. The body contact region BC is electrically coupled to the source region SR via the back gate plug BGP, the source interconnection (SL1), and the source plug SP that are electrically coupled to one another. As described above, the cathode region KR of the temperature sensing diode is electrically coupled to the source region SR of the power MOSFET along a path including the cathode plug KP, the source interconnection (SL1), the plug PLG, the p-type semiconductor region PR, the p-type base layer PBL, the body contact region BC, the back gate plug BGP, the source interconnection (SL1), the source plug SP, and the source region SR in this order.

As described above, the cathode region KR of the temperature sensing diode TD and the source region SR of the power MOSFET are also electrically coupled to each other with the same potential through such a path. Thus, according to the device structure of the semiconductor device of the first embodiment, the circuital characteristic point of the first embodiment is achieved through two types of coupling paths.

In this way, in the first embodiment, the cathode region KR of the temperature sensing diode TD is electrically coupled to the source region (SR) of the power MOSFET through the two types of coupling paths; hence, coupling resistance (parasitic resistance) can be reduced. In particular, as illustrated in FIG. 6, the cathode region KR of the temperature sensing diode TD is coupled to the source region (SR) of the power MOSFET by the source interconnection SL1 as a metal interconnection (aluminum interconnection) having a low resistivity, thereby the cathode region KR can be coupled to the source region (SR) with the same potential.

The source interconnection SL1 (cathode interconnection KL), which couples the cathode region KR of the temperature sensing diode TD to the source region (SR) of the power MOSFET, extends in the x direction while being in parallel with other source interconnections SL1. An anode interconnection AL, which is coupled to the anode region AR of the temperature sensing diode TD via the anode plug AP, also extends in the x direction.

Such an interconnection structure is summarized as follows. In short, the semiconductor device of the first embodiment includes the source interconnections SL1 which are each electrically coupled to the low-potential terminal (source), and extend in the x direction while being in parallel with one another. The temperature sensing diode TD is disposed at a position sandwiched in a plan view by a first source interconnection (SL1) and a second source interconnection (SL1) among the source interconnections SL1. The cathode region KR of the temperature sensing diode TD is electrically coupled to the source interconnection for cathode coupling, which is sandwiched by the first source interconnection (SL1) and the second source interconnection (SL1) in a plan view, and extends in the x direction.

FIG. 7 is a plan view illustrating a configuration of a source interconnection SL2 disposed over the source interconnection SL1. As illustrated in FIG. 7, the source interconnection SL2 provided over the source interconnection SL1 has a plane area larger than that of the source interconnection SL1. Specifically, the source interconnection SL2 serves as an interconnection collectively coupled to the source interconnections SL1 disposed thereunder, and thus electrically couples the source interconnections SL1 to one another therethrough. Such large area of the source interconnection SL2 reduces the interconnection resistance of the power MOSFET, resulting in a reduction in on resistance of the power MOSFET.

In this way, the device structure (including the interconnection structure) of the semiconductor device of the first embodiment is configured, and the circuital characteristic point of the first embodiment is embodied by the device structure. The device structure achieving the circuital characteristic point of the first embodiment has a device-structural characteristic point reflecting the circuital characteristic point. The device-structural characteristic point improves the response characteristic (following capability of temperature sensing) of the temperature sensing diode TD to heating of the power MOSFET Q1. The device-structural characteristic point of the first embodiment is now described, so that it is described that the response characteristic of the temperature sensing diode TD can be improved by the first embodiment.

Device-Structural Characteristic Point of First Embodiment

For example, the device-structural characteristic point of the first embodiment is that, as illustrated in FIG. 6, the cathode region KR of the temperature sensing diode TD is electrically coupled to the source region SR of the power MOSFET by the source interconnection SL1 (cathode interconnection KL) as a metal interconnection. Thus, according to the first embodiment, the cathode region KR of the temperature sensing diode TD is electrically coupled to the source region SR of the power MOSFET with the same potential.

The device-structural characteristic point of the first embodiment therefore provides the following first advantage. Specifically, the cathode region KR of the temperature sensing diode TD is electrically coupled to the source region SR of the power MOSFET with the same potential, which means that the withstand voltage between the cathode region KR and the source region SR may not be maintained because there is no potential difference therebetween. Thus, the withstand voltage between the cathode region KR and the source region SR may not be maintained. This means that the isolating structure for maintaining the withstand voltage may not be provided between the temperature sensing diode TD and the power MOSFET. As a result, according to the first embodiment, since the isolating structure is not provided, the distance between the temperature sensing diode TD and the power MOSFET can be reduced.

Hence, according to the first embodiment, for example, even if the power MOSFET Q1 abruptly produces heat, temperature of the power MOSFET can be accurately sensed due to the improved following capability of temperature sensing (response characteristic) of the temperature sensing diode TD. Consequently, even if the power MOSFET abruptly produces heat, such heating can be promptly sensed by the temperature sensing diode TD, and thus the protective circuit can be operated to turn off the power MOSFET before breakdown of the power MOSFET. As a result, according to the first embodiment, the power MOSFET can be effectively protected from being broken.

Figure 8B:
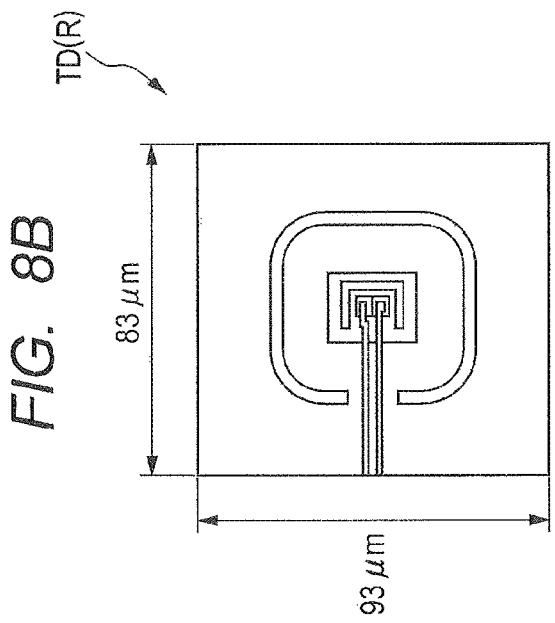
FIG. 8B is a schematic view illustrating a temperature sensing diode disposed in a region of FIG. 8A in an enlarged manner.
Figure 8A:
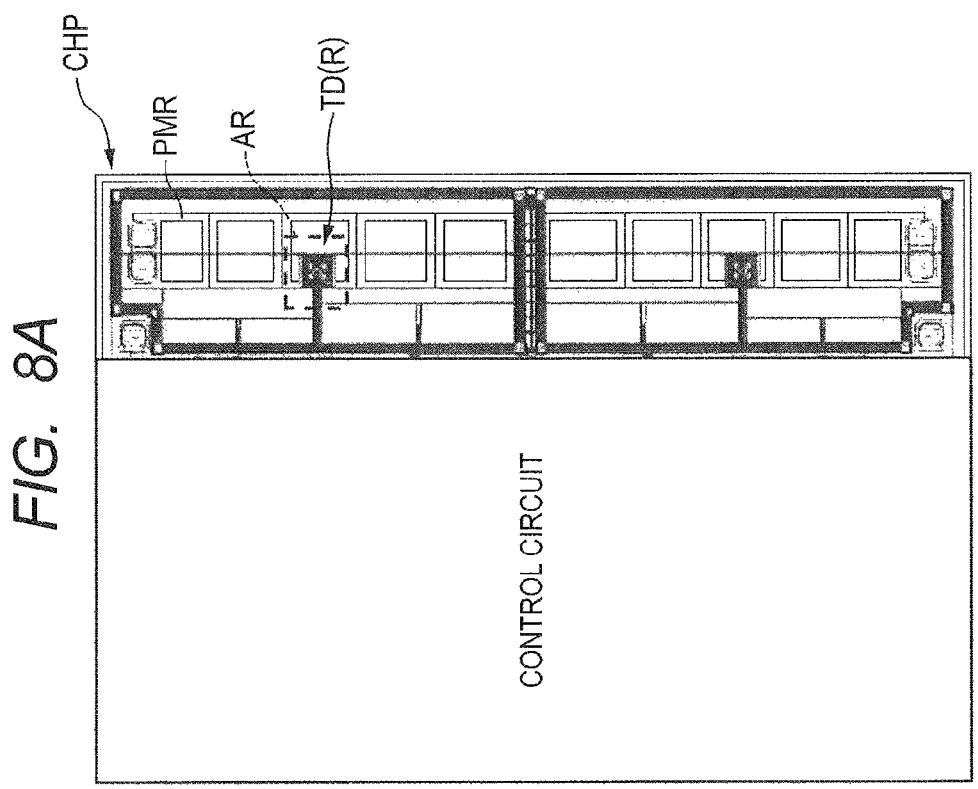
FIG. 8A illustrates a layout configuration of a semiconductor chip.

For example, FIGS. 8A and 8B each illustrate a device structure in a related art. Specifically, FIG. 8A illustrates a layout configuration of a semiconductor chip CHP, and FIG. 8B is a schematic view illustrating a temperature sensing diode TD(R) disposed in a region AR in FIG. 8A in an enlarged manner.

The semiconductor chip CHP of the related art illustrated in FIG. 8A has a control circuit region shown on the left side and a power MOSFET formation region PMR shown on the right side, and a temperature sensing diode TD(R) is provided in the partial region AR of the power MOSFET formation region PMR.

Since the related art is designed on the assumption that the temperature sensing diode TD(R) is electrically separated from the power MOSFET, there is a need to maintain the withstand voltage between the temperature sensing diode TD(R) and the power MOSFET. In the related art, therefore, as illustrated in FIG. 8B, the temperature sensing diode TD(R) has the isolating structure to maintain the withstand voltage. As illustrated in FIG. 8B, this leads to a large aerial occupancy of the temperature sensing diode TD(R) including the isolating structure, for example, about 83 µm wide and 93 µm long. This means a long distance between the temperature sensing diode TD(R) and the power MOSFET in the related art, leading to a long time for heat conduction from the power MOSFET as a heat source to the temperature sensing diode TD(R). As a result, the following capability of temperature sensing (response characteristic) to abrupt heating of the power MOSFET is bad in the related art.

FIGS. 9A and 9B each illustrate a device structure in the first embodiment. Specifically, FIG. 9A illustrates a layout configuration of the semiconductor chip CHP, and FIG. 9B illustrates a temperature sensing diode TD disposed in a region BR in FIG. 9A in an enlarged manner.

In the first embodiment, the cathode region KR of the temperature sensing diode TD is electrically coupled to the source region SR of the power MOSFET by the source interconnection SL1 as a metal interconnection. Thus, according to the first embodiment, there is no need to provide the isolating structure for maintaining the withstand voltage between the temperature sensing diode TD and the power MOSFET. As illustrated in FIG. 9B, this allows the aerial occupancy of the temperature sensing diode TD to be reduced to, for example, about 10 µm wide and 3 µm long. This means a shorter distance between the temperature sensing diode TD and the power MOSFET in the first embodiment, allowing a shorter time for heat conduction from the power MOSFET as a heat source to the temperature sensing diode TD. As a result, the temperature sensing diode TD of the first embodiment is improved in following capability of temperature sensing (response characteristic) to abrupt heating of the power MOSFET. In short, according to the first embodiment, even if the power MOSFET abruptly produces heat, such heating can be promptly sensed by the temperature sensing diode TD, and thus the protective circuit can be operated to turn off the power MOSFET before breakdown of the power MOSFET.

Furthermore, the device-structural characteristic point of the first embodiment provides the following second advantage. For example, when the temperature sensing diode TD is electrically isolated from the power MOSFET, heat produced by the power MOSFET is largely conducted to the temperature sensing diode TD through silicon (Si) as a chief material of the semiconductor chip.

In contrast, in the first embodiment, as illustrated in FIG. 6, the temperature sensing diode TD is coupled to the power MOSFET though the source interconnection SL1 as a metal interconnection (aluminum interconnection) having a high heat conductivity. Hence, heat produced by the power MOSFET can be readily conducted to the temperature sensing diode TD through the source interconnection SL1. That is, according to the first embodiment, since the temperature sensing diode TD is coupled to the power MOSFET though the metal interconnection (source interconnection SL1) having a heat conductivity higher than that of silicon, heat produced by the power MOSFET is readily conducted to the temperature sensing diode TD through the source interconnection SL1 having a heat conductivity higher than that of silicon.

In other words, the first embodiment provides the first advantage of the short distance between the temperature sensing diode TD and the power MOSFET, and the second advantage of an improvement in heat conduction efficiency from the power MOSFET to the temperature sensing diode TD. Consequently, the first embodiment provides a significant effect of improving the following capability of temperature sensing (response characteristic) to abrupt heating of the power MOSFET through a synergy effect of the first and second advantages.

As described above, the source interconnection SL1 in the first embodiment, which couples the temperature sensing diode TD to the power MOSFET, has a technical meaning of allowing the cathode region KR and the source region SR to have the same potential, and a technical meaning of improving the heat conduction efficiency from the power MOSFET to the temperature sensing diode TD.

Modification

Although the first embodiment has been described with an exemplary case where the technical idea of the first embodiment is applied to a high-side switch, the technical idea is not limited thereto and can be applied to a low-side switch. This modification is now described with an exemplary case where the technical idea of the first embodiment is applied to a low-side switch.

Figure 10:
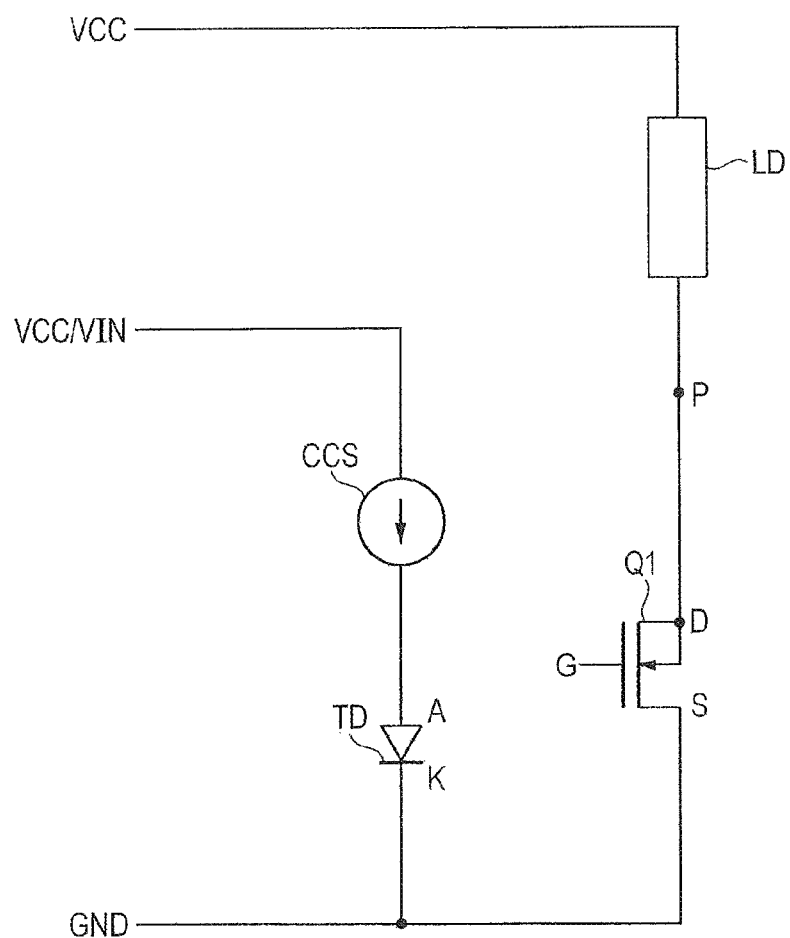
FIG. 10 is a circuit diagram illustrating an exemplary circuit configuration of a semiconductor device according to a modification.

FIG. 10 is a circuit diagram illustrating an exemplary circuit configuration of a semiconductor device according to this modification. The semiconductor device of this modification configures a low-side switch using a power MOSFET Q1 including an n-channel MOSFET, for example.

Specifically, FIG. 10 illustrates a circuit configuration of a semiconductor device with a power MOSFET Q1 as a switching element that drives a load LD. Specifically, as illustrated in FIG. 10, the semiconductor device of this modification includes the power MOSFET Q1 serving as the switching element, a temperature sensing diode TD that senses temperature of the power MOSFET Q1, and a constant current source CCS that supplies a current having a certain value to the temperature sensing diode TD, and configures the low-side switch that drives the load LD.

For example, as illustrated in FIG. 10, in this modification, the load LD and the power MOSFET Q1 are coupled in series between a power line VCC through which a power potential is supplied, and a reference line (ground line) GND through which a reference potential (ground potential) is supplied. That is, the source S of the power MOSFET Q1 is disposed on a side close to the reference line GND, and the drain D of the power MOSFET Q1 is disposed on a side close to the load. The load LD is coupled between the drain D of the power MOSFET Q1 and the power line VCC. The gate electrode G of the power MOSFET Q1 is electrically coupled to an undepicted gate drive circuit. In such a circuit configuration, the power MOSFET Q1 is disposed on a reference potential side having a potential lower than that of the load LD, and is therefore called low-side switch.

For the low-side switch configured in this way, even if the power MOSFET Q1 is turned on, the source S of the power MOSFET Q1 maintains the reference potential (0 V) unlike the high-side switch. Hence, although a potential, which is equal to or higher than the threshold voltage and higher than a potential of the source S, must be applied to the gate electrode G of the power MOSFET Q1 including the n-channel MOSFET, since the source S maintains the reference potential, a gate potential lower than the source potential can be applied to the gate electrode G. That is, for the low-side switch, unlike the high-side switch, there is no need to supply a potential higher than the source potential to the gate electrode G to turn on the power MOSFET Q1. Hence, for the low-side switch, the boosting circuit typified by the charge pump circuit or the bootstrap circuit is not necessary.

In some case using the low-side switch, there is achieved the circuital characteristic point that the cathode K of the temperature sensing diode TD and the source S of the power MOSFET Q1 are electrically coupled to each other so as to have the same potential. In such a case, unlike the high-side switch, the low-side switch allows the anode A of the temperature sensing diode TD to be coupled to the power line VCC (or input line VIN) via the constant current source CCS. This is because when the power MOSFET Q1 is turned on, the drain D and the source S of the low-side switch also have substantially the same potential that is the reference potential rather than the source potential unlike the high-side switch. Specifically, for the low-side switch, even if the power MOSFET Q1 is turned on, the configuration, in which the anode A of the temperature sensing diode TD is coupled to the power line VCC, allows a potential difference (source potential minus reference potential) to be maintained between the anode A and the cathode K of the temperature sensing diode TD. As a result, for the low-side switch, even if the anode A is coupled to the power line VCC, a current can be applied to the temperature sensing diode TD by the constant current source CCS, and thus the temperature sensing diode TD can be operated. Hence, when the low-side switch is configured of the n-channel MOSFET, as illustrated in FIG. 10, the anode A of the temperature sensing diode TD can be coupled to the power line VCC (or input line VIN), through which the source potential is supplied, via the constant current source CCS. In short, for the low-side switch, the boosting circuit is not necessary to achieve the circuital characteristic point that the cathode K of the temperature sensing diode TD and the source S of the power MOSFET Q1 are electrically coupled to each other so as to have the same potential.

As described above, when the low-side switch of this modification is used to achieve the circuital characteristic point, the boosting circuit is unnecessary, leading to a simple circuit configuration. Thus, according to this modification, cost is advantageously reduced compared with the configuration where the circuital characteristic point is achieved with the high-side switch.

Second Embodiment

The technical idea of a second embodiment is now described. The technical idea of the second embodiment is roughly the same as that of the first embodiment; hence, differences are mainly described.

Figure 11:
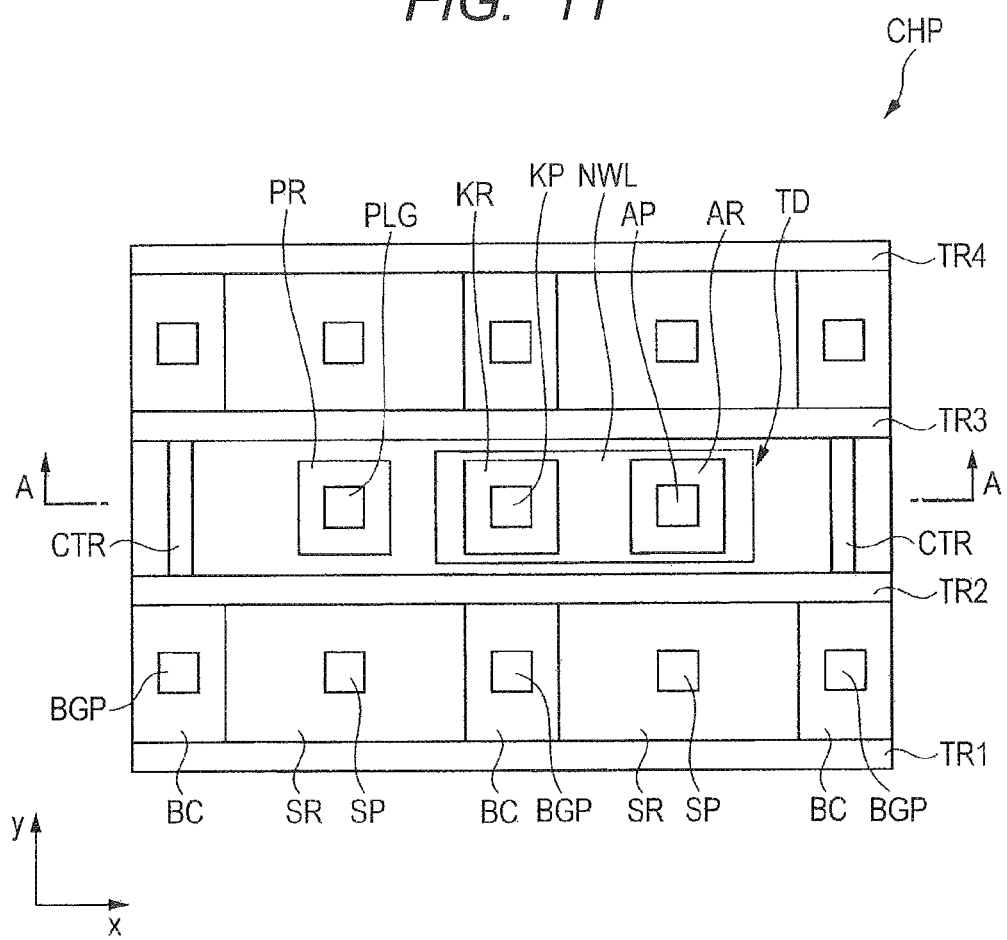
FIG. 11 is a partial enlarged view of a semiconductor chip of a second embodiment.

FIG. 11 is an enlarged plan view of a partial region of a semiconductor chip CHP of the second embodiment. Referring to FIG. 11, a characteristic point of the second embodiment is that cutoff trenches CTR are provided between a pair of trenches sandwiching the temperature sensing diode TD in a plan view. Specifically, as illustrated in FIG. 11, the semiconductor chip CHP of the second embodiment includes a pair of cutoff trenches CTR extending in a y direction intersecting with the x direction while being in parallel with each other, where the temperature sensing diode TD is provided in a region enclosed by the pair of trenches and the pair of cutoff trenches in a plan view.

Figure 12:
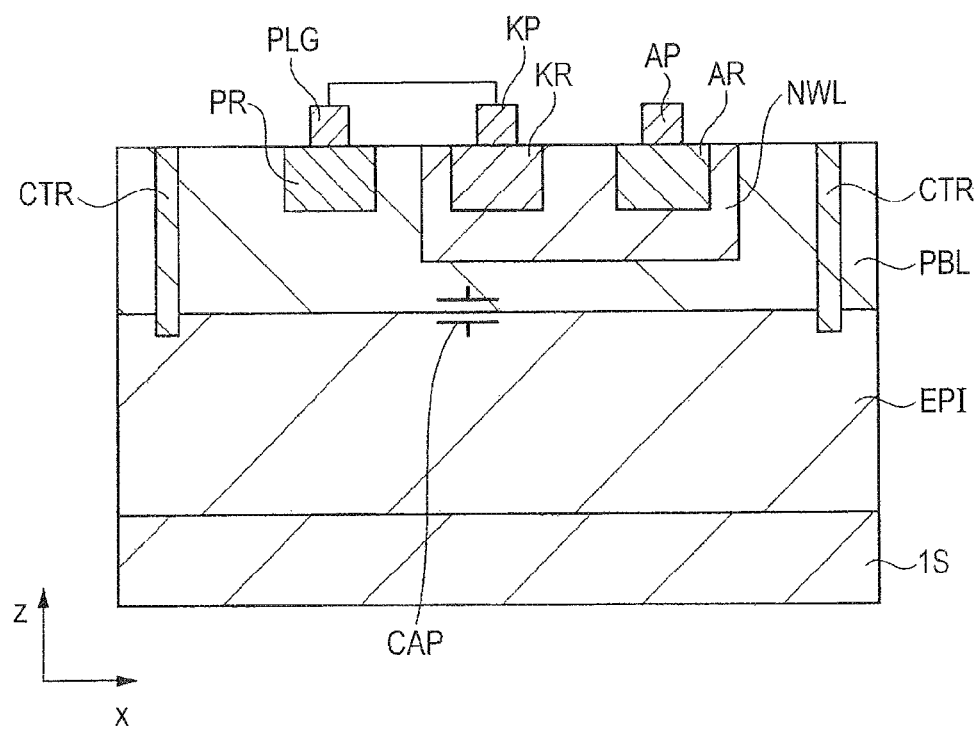
FIG. 12 is a section view along a line A-A in FIG. 11.

FIG. 12 is a section view along a line A-A in FIG. 11. Referring to FIG. 12, the epitaxial layer EPI including the n-type semiconductor region is provided on the semiconductor substrate 1S, and the p-type base layer PBL including the p-type semiconductor region is provided on the epitaxial layer EPI. The temperature sensing diode including the anode region AR and the cathode region KR is provided in the p-type base layer PBL. Each of the cutoff trenches CTR runs up to the epitaxial layer EPI through the p-type base layer PBL, and a polysilicon film is provided over an undepicted gate insulating film in the inside of each of the cutoff trenches while filling the inside.

As illustrated in FIG. 12, the characteristic point of the second embodiment is that the pair of cutoff trenches CTR sandwiching the temperature sensing diode are provided. Thus, according to the second embodiment, the following advantage is provided. For example, referring to FIG. 12, since a p-n junction is formed in a boundary region between the epitaxial layer EPI including the n-type semiconductor region and the p-type base layer PBL including the p-type semiconductor region, a junction capacitance CAP exists in the boundary region. If the cutoff trenches CTR as illustrated in FIG. 12 are not provided, the junction capacitance CAP in the boundary region between the epitaxial layer EPI and the p-type base layer PBL has an extremely large area. Such larger area of the junction capacitance CAP means a larger capacitance value thereof.

A relational expression Q=CV is established, where C is a capacitance value of the junction capacitance CAP, Q is a charge amount accumulated in the junction capacitance CAP, and V is a voltage applied to the junction capacitance CAP. For example, if the voltage V applied to the junction capacitance CAP varies with time due to noise, the charge amount Q accumulated in the junction capacitance CAP also varies with time according to the above-described relational expression. Even if temporal variation of the voltage V due to noise is constant, temporal variation of the charge amount Q accumulated in the junction capacitance CAP increases as the capacitance value C of the junction capacitance CAP increases. Since the temporal variation (temporal differentiation) of the charge amount Q accumulated in the junction capacitance CAP corresponds to a parasitic current (rush current), magnitude of the parasitic current due to a serge voltage increases with an increase in the capacitance value C of the junction capacitance CAP. Referring to FIG. 12, such an increase in magnitude of the parasitic current increases a current applied to a base resistance of a parasitic NPN bipolar transistor including the epitaxial layer EPI as a collector, the p-type base layer PBL as a base, and the cathode region KR as an emitter. This means a larger voltage drop across the base resistance, leading to a potential difference between the base and the emitter of the parasitic NPN bipolar transistor. If the potential difference exceeds a certain value, the parasitic NPN bipolar transistor is turned on. Specifically, an increase in the capacitance value C of the junction capacitance CAP increases magnitude of the parasitic current due to a serge voltage. This allows the parasitic NPN bipolar transistor to be easily turned on, leading to false operation. It is therefore desirable to reduce the capacitance value C of the junction capacitance CAP in light of suppressing on operation of the parasitic NPN bipolar transistor.

On this point, in the second embodiment, each of the cutoff trenches CTR runs up to the epitaxial layer EPI through the p-type base layer PBL as illustrated in FIG. 12. Consequently, according to the second embodiment, area of the junction capacitance CAP can be reduced. As a result, according to the second embodiment, magnitude of the parasitic current due to noise such as a serge voltage can be reduced, which makes it possible to suppress on operation of the parasitic NPN bipolar transistor. Thus, according to the second embodiment, false operation due to the parasitic NPN bipolar transistor can be reduced, and thus reliability of the semiconductor device can be improved.

Third Embodiment

The technical idea of a third embodiment is now described. The technical idea of the third embodiment is roughly the same as that of the first embodiment; hence, differences are mainly described.

Figure 13:
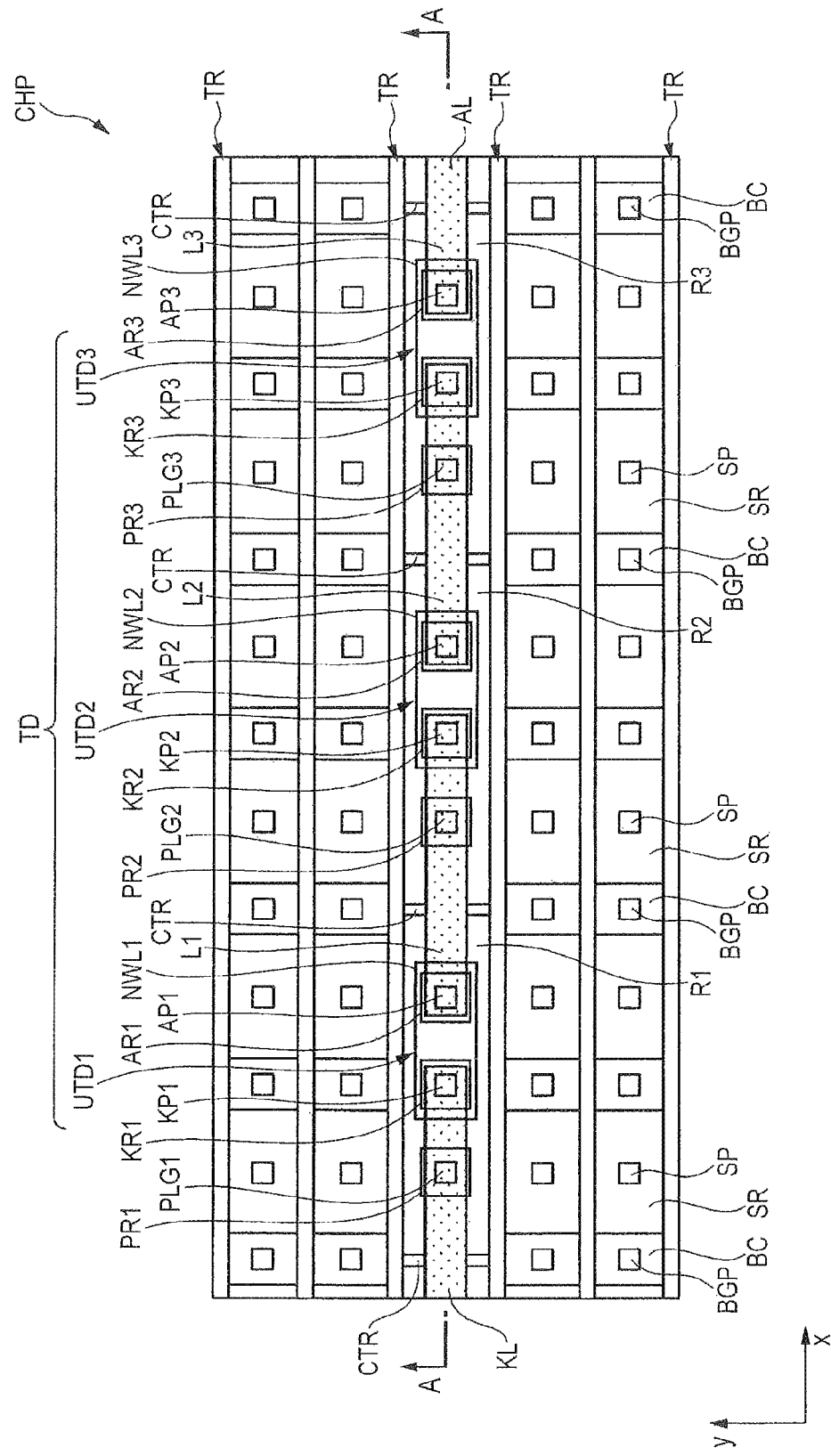
FIG. 13 is a partial enlarged view of a semiconductor chip of a third embodiment.
Figure 14:
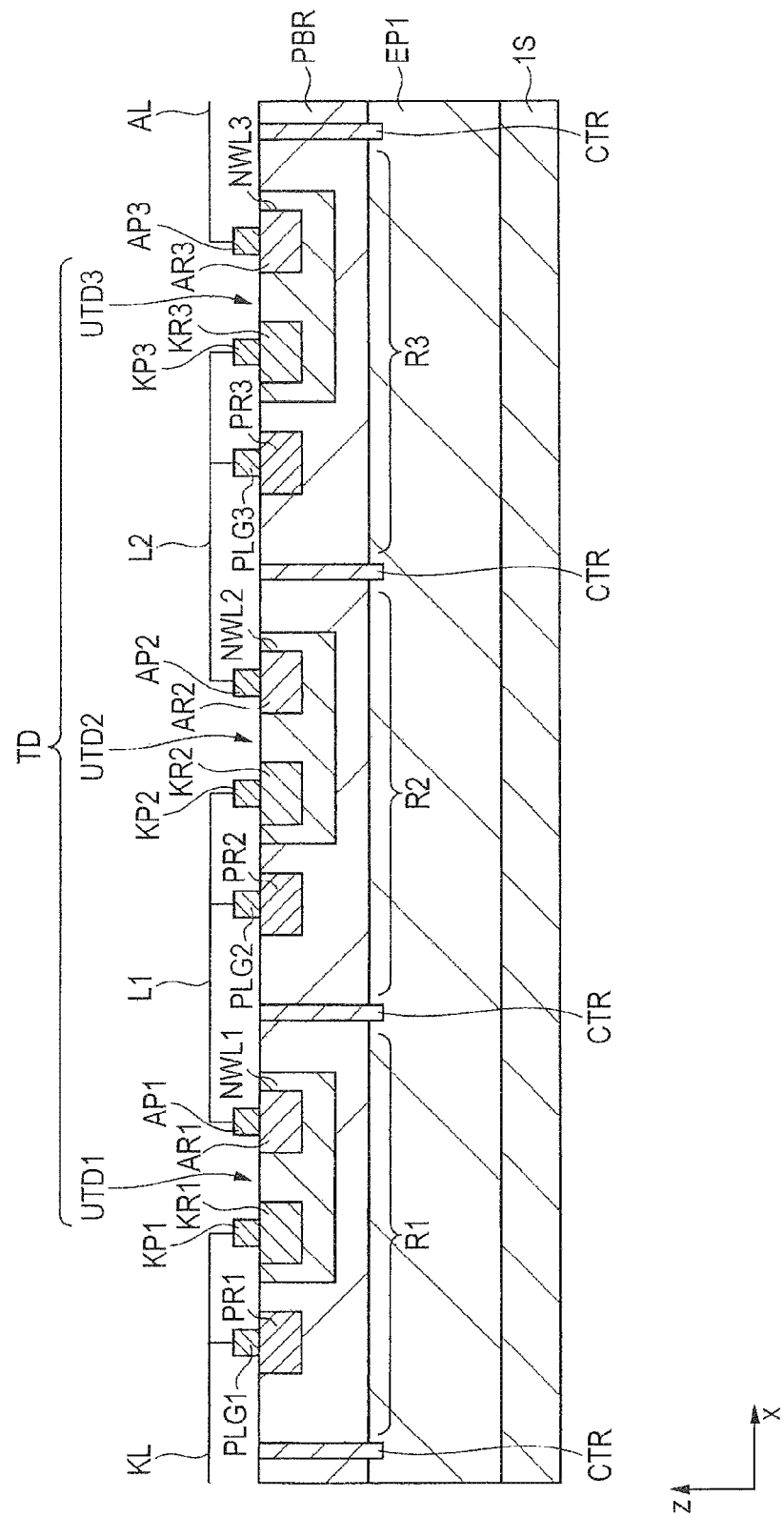
FIG. 14 is a section view along a line A-A in FIG. 13.

FIG. 13 is an enlarged plan view of a partial region of a semiconductor chip CHP of the third embodiment. FIG. 14 is a section view along a line A-A in FIG. 13. Referring to FIG. 13, a characteristic point of the third embodiment is that the temperature sensing diode is configured of a plurality of unit diodes coupled in series. Specifically, as illustrated in FIG. 13, the temperature sensing diode TD of the third embodiment is configured of series coupling of a unit diode UTD1, a unit diode UTD2, and a unit diode UTD3.

Specifically, as illustrated in FIG. 13, the semiconductor chip CHP has a region R1, a region R2, and a region R3 as regions enclosed by a pair of trenches TR and a pair of cutoff trenches CTR. A unit transistor UTD1 is provided in the region R1, a unit transistor UTD2 is provided in the region R2, and a unit transistor UTD3 is provided in the region R3.

As illustrated in FIGS. 13 and 14, a p-type semiconductor region PR1 and an n-type well NWL1 are separately provided in the region R1, and a cathode region KR1 and an anode region AR1 are separately provided in the inside of the n-type well NWL1. The p-type semiconductor region PR1 is electrically coupled to a cathode interconnection (source interconnection) KL via a plug PLG1, and the cathode region KR1 is also electrically coupled to the cathode interconnection KL via a cathode plug KP1. The anode region AR1 is electrically coupled to an interconnection L1 via an anode plug AP1.

A p-type semiconductor region PR2 and an n-type well NWL2 are separately provided in the region R2, and a cathode region KR2 and an anode region AR2 are separately provided in the inside of the n-type well NWL2. The p-type semiconductor region PR2 is electrically coupled to the interconnection L1 via a plug PLG2, and the cathode region KR2 is also electrically coupled to the interconnection L1 via a cathode plug KP2. The anode region AR2 is electrically coupled to an interconnection L2 via an anode plug AP2.

Similarly, a p-type semiconductor region PR3 and an n-type well NWL3 are separately provided in the region R3, and a cathode region KR3 and an anode region AR3 are separately provided in the inside of the n-type well NWL3. The p-type semiconductor region PR3 is electrically coupled to the interconnection L2 via a plug PLG3, and the cathode region KR3 is also electrically coupled to the interconnection L2 via a cathode plug KP3. The anode region AR3 is electrically coupled to an anode interconnection AL via an anode plug AP3.

In this way, the temperature sensing diode TD of the third embodiment is configured. As illustrated in FIGS. 13 and 14, the characteristic point of the third embodiment is that the temperature sensing diode TD is configured of series coupling of the unit diode UTD1, the unit diode UTD2, and the unit diode UTD3. Thus, the third embodiment provides the following advantage.

Specifically, the temperature sensing diode TD is configured of (at least two stages of) series coupling of a plurality of unit diodes, thereby when a constant current (I) is applied to the temperature sensing diode TD, the VF value can be an added value of voltage values of the unit diodes coupled in series. Specifically, although a temperature characteristic (temperature coefficient) of a typical unit diode (p-n junction diode) is −2 mV/° C., the temperature characteristic is −4 mV/° C. for series coupling in two stages, and −6 mV/° C. for series coupling in three stages, for example. In this way, increasing the number of stages of series coupling increases the temperature coefficient, which in turn increases a variation in VF value of the entire temperature sensing diode TD to a variation in temperature. As a result, the temperature sensing diode TD of the third embodiment improves sensing accuracy of temperature. However, if the number of stages of series coupling increases, a potential of the anode interconnection AL coupled to an anode of a unit diode in a final stage increases in correspondence to the number of stages of the unit diodes. Consequently, an excessive increase in the number of stages of series coupling may lead to a need of considering the withstand voltage between the anode interconnection AL and the source interconnection.

As described above, the number of unit diodes configuring the temperature sensing diode TD is desired to be increased in light of improving the sensing accuracy of temperature. However, it must be noticed that an excessive increase in number of unit diodes coupled in series causes the need to consider the withstand voltage between the anode interconnection AL and the source interconnection.

Fourth Embodiment

A fourth embodiment is described on a design for disposing the temperature sensing diode in a power MOSFET formation region.

For example, given that the temperature sensing diode is provided to monitor the temperature of the power MOSFET to prevent breakdown of the power MOSFET, the temperature sensing diode is desirably disposed in "hot-spot region" having a highest temperature in the power MOSFET formation region. This is because a power MOSFET, which exists in the vicinity of the hot-spot region having the highest temperature in the power MOSFET formation region, is most likely to be broken by heat. In other words, the temperature sensing diode is desirably disposed in a region, in which the power MOSFET is most likely to be broken, in the power MOSFET formation region in light of preventing breakdown of the power MOSFET. Hence, in the fourth embodiment, the temperature sensing diode is disposed in the hot-spot region having the highest temperature in the power MOSFET formation region in which the power MOSFET is provided.

Figure 15:
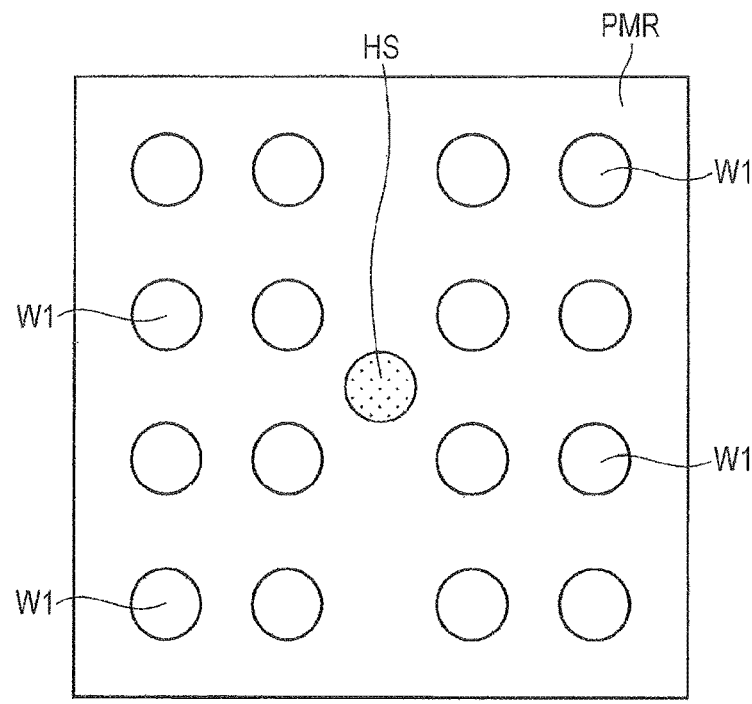
FIG. 15 is a schematic view illustrating a power MOSFET formation region.

Specifically, FIG. 15 is a schematic view illustrating a power MOSFET formation region PMR, on the surface of which, for example, a plurality of wire balls W1 are mounted in arrays. For example, a copper wire or a gold wire 50 µm in diameter is used as each of the wires disposed in such a manner. In such a case, as illustrated in FIG. 15, the hot-spot region probably exists in the center of the power MOSFET formation region PMR. This is because heat is less likely to be dissipated from the center of the power MOSFET formation region and is likely to be trapped therein. Hence, for example, referring to FIG. 15, the temperature sensing diode is disposed in a hot-spot region HS in the center of the power MOSFET formation region PMR, thereby breakdown of the power MOSFET can be effectively prevented.

Figure 16:
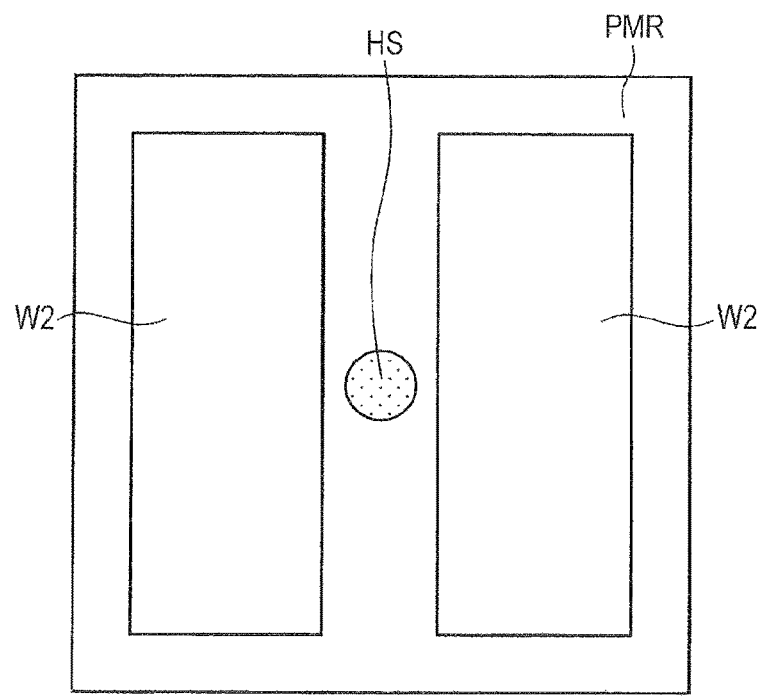
FIG. 16 is a schematic view illustrating a power MOSFET formation region.

Similarly, FIG. 16 is a schematic view illustrating a power MOSFET formation region PMR, on the surface of which, for example, a plurality of reed-shaped wire seats W2 are mounted. For example, an aluminum wire 500 µm in diameter is used as each of the wires disposed in such a manner. In such a case, as illustrated in FIG. 16, the hot-spot region probably exists in the center of the power MOSFET formation region PMR. This is because heat is less likely to be dissipated from the center of the power MOSFET formation region and is likely to be trapped therein. Hence, for example, referring to FIG. 16, the temperature sensing diode is disposed in a hot-spot region HS in the center of the power MOSFET formation region PMR, thereby breakdown of the power MOSFET can be effectively prevented.

Although the invention achieved by the inventors has been described in detail according to some embodiments thereof hereinbefore, the invention should not be limited thereto, and it will be appreciated that various modifications or alterations thereof may be made within the scope without departing from the gist of the invention.

Although the above-described embodiments have been described with a power MOSFET as a specific example of the power transistor to which the technical idea of each of the embodiments is applied, the technical idea can be applied to, for example, an insulated gate bipolar transistor (IGBT) without limitation. For example, the high-potential terminal and the low-potential terminal of the power transistor correspond to the drain (drain terminal) and the source (source terminal), respectively, of the power MOSFET. In addition, for example, the high-potential terminal and the low-potential terminal of the power transistor correspond to the collector (collector terminal) and the emitter (emitter terminal), respectively, of the IGBT.

What is claimed is:
1. A semiconductor device, comprising:
a power transistor that passes a current from a high-potential terminal to a low-potential terminal, the power transistor comprising a gate electrode insulated from a channel region of the power transistor by an insulating film; and
a temperature sensing diode that senses a variation in temperature due to heating of the power transistor,
wherein the low-potential terminal of the power transistor and a cathode of the temperature sensing diode are directly electrically connected to each other so as to have a same potential.

2. The semiconductor device according to claim 1, wherein the power transistor configures a high-side switch.

3. The semiconductor device according to claim 1, wherein the power transistor configures a low-side switch.

4. The semiconductor device according to claim 1, wherein an anode of the temperature sensing diode is electrically coupled to a constant current source.

5. The semiconductor device according to claim 1, wherein the temperature sensing diode is configured of a plurality of unit diodes coupled in series.

6. The semiconductor device according to claim 1, wherein the semiconductor device includes a plurality of low-potential interconnections electrically coupled to the low-potential terminal,
wherein the low-potential interconnections extend in a first direction while being in parallel with one another,
wherein the temperature sensing diode is disposed at a position sandwiched by a first low-potential interconnection and a second low-potential interconnection among the low-potential interconnections in a plan view,
wherein a cathode of the temperature sensing diode is electrically coupled to a low-potential interconnection for cathode coupling sandwiched by the first low-potential interconnection and the second low-potential interconnection in the plan view, and
wherein the low-potential interconnection for cathode coupling extends in the first direction.

7. The semiconductor device according to claim 1, wherein the power transistor includes:
a plurality of trenches;
the insulating film provided over an inner wall of each of the trenches; and
the gate electrode provided via the insulating film while filling each of the trenches.

8. The semiconductor device according to claim 7, wherein the trenches extend in a first direction while being in parallel with one another, and
wherein the temperature sensing diode is disposed at a position sandwiched by a first trench and a second trench among the trenches in a plan view.

9. The semiconductor device according to claim 8, wherein the semiconductor device includes a first cutoff trench and a second cutoff trench that extend in a second direction intersecting with the first direction while being in parallel with each other, and
wherein the temperature sensing diode is provided in a region enclosed by the first and second trenches and the first and second cutoff trenches in a plan view.

10. The semiconductor device according to claim 9, wherein the semiconductor device includes:
a semiconductor substrate;
an epitaxial layer having a first conductivity type provided over the semiconductor substrate; and
a base layer having a second conductivity type opposite to the first conductivity type provided over the epitaxial layer,
wherein each of the first and second cutoff trenches runs up to the epitaxial layer through the base layer.

11. The semiconductor device according to claim 1, wherein the semiconductor device includes:
   a semiconductor substrate;
   an epitaxial layer having a first conductivity type provided over the semiconductor substrate;
   a base layer having a second conductivity type opposite to the first conductivity type provided over the epitaxial layer;
   a well having the first conductivity type provided in the base layer;
   a cathode region having the first conductivity type contained in the well; and
   an anode having the second conductivity type contained in the well and disposed separately from the cathode region.

12. The semiconductor device according to claim 1, wherein the temperature sensing diode is disposed in a hot-spat region having a highest temperature in a power transistor formation region in which the power transistor is provided.

13. The semiconductor device according to claim 1, wherein the temperature sensing diode is disposed in a center of a power transistor formation region in which the power transistor is provided in a plan view.

14. The semiconductor device according to claim 1, wherein the power transistor comprises a power MOSFET, and wherein the low-potential terminal of the power transistor comprises a source terminal of the power MOSFET.

15. The semiconductor device according to claim 1, wherein the power transistor comprises an insulated gate bipolar transistor, and
   wherein the low-potential terminal of the power transistor comprises an emitter terminal of the insulated gate bipolar transistor.

16. The semiconductor device according to claim 1, wherein the temperature sensing diode is directly connected to a constant current source that supplies a constant current to the temperature sensing diode.

17. The semiconductor device according to claim 1, wherein an anode of the temperature sensing diode is directly connected to a constant current source that supplies a constant current to the temperature sensing diode.

18. The semiconductor device according to claim 17, wherein the constant current source is connected to a potential line that provides a potential to the constant current source that is higher than a potential of a source of the power transistor.

19. The semiconductor device according to claim 18, wherein the temperature sensing diode senses the temperature by measuring a voltage between the potential line and a node located between the temperature sensing diode and the source of the power transistor.

* * * * *